(12) United States Patent
Bircumshaw et al.

(10) Patent No.: US 12,172,189 B2
(45) Date of Patent: Dec. 24, 2024

(54) INTEGRATION TECHNIQUES FOR MICROMACHINED PMUT ARRAYS AND ELECTRONICS USING THERMOCOMPRESSION BONDING, EUTECTIC BONDING, AND SOLDER BONDING

(71) Applicant: eXo Imaging, Inc., Redwood City, CA (US)

(72) Inventors: Brian Bircumshaw, Oakland, CA (US); Sandeep Akkaraju, Wellesley, MA (US)

(73) Assignee: Exo Imaging, Inc., Santa Clara, CA (US)

( * ) Notice: Subject to any disclaimer, the term of this patent is extended or adjusted under 35 U.S.C. 154(b) by 776 days.

(21) Appl. No.: 17/119,737

(22) Filed: Dec. 11, 2020

(65) Prior Publication Data
US 2021/0094070 A1    Apr. 1, 2021

Related U.S. Application Data

(63) Continuation of application No. 17/095,333, filed on Nov. 11, 2020, which is a continuation of application No. PCT/US2019/032062, filed on May 13, 2019.
(Continued)

(51) Int. Cl.
*B06B 1/00* (2006.01)
*B06B 1/06* (2006.01)
(Continued)

(52) U.S. Cl.
CPC ........ *B06B 1/0622* (2013.01); *G01S 7/52019* (2013.01); *G01S 7/52023* (2013.01);
(Continued)

(58) Field of Classification Search
CPC .......... B06B 1/00–063; B06B 2201/76; G01S 7/52019; G01S 7/52023; G01S 15/8906;
(Continued)

(56) References Cited

U.S. PATENT DOCUMENTS

| | | |
|---|---|---|
| 4,511,052 A | 4/1985 | Klein et al. |
| 5,127,410 A | 7/1992 | King et al. |

(Continued)

FOREIGN PATENT DOCUMENTS

| | | |
|---|---|---|
| CN | 103178204 A | 6/2013 |
| CN | 106536067 A | 3/2017 |

(Continued)

OTHER PUBLICATIONS

PCT/US2022/012126 International Search Report and Written Opinion dated Apr. 1, 2022.
(Continued)

*Primary Examiner* — Nguyen Q. Ha
(74) *Attorney, Agent, or Firm* — Morgan, Lewis & Bockius LLP

(57) ABSTRACT

The present disclosure provides methods to integrate piezoelectric micromachined ultrasonic transducer (pMUT) arrays with an application-specific integrated circuit (ASIC) using thermocompression or eutectic/solder bonding. In an aspect, the present disclosure provides a device comprising a first substrate and a second substrate, the first substrate comprising a pMUT array and the second substrate comprising an electrical circuit, wherein the first substrate and the second substrate are bonded together using thermocompression, wherein any set of individual PMUTs of PMUT array is addressable. In another aspect, the present disclosure provides a device comprising a first substrate and a second substrate, the first substrate comprising a pMUT array and the second substrate comprising an electrical circuit,
(Continued)

wherein the first substrate and the second substrate are bonded together using eutectic or solder bonding, wherein any set of individual PMUTs of the PMUT array is addressable.

30 Claims, 12 Drawing Sheets

Related U.S. Application Data

(60) Provisional application No. 62/671,361, filed on May 14, 2018.

(51) Int. Cl.
| | |
|---|---|
| *G01S 7/52* | (2006.01) |
| *G01S 15/89* | (2006.01) |
| *H10N 30/073* | (2023.01) |
| *H10N 30/088* | (2023.01) |
| *H10N 30/80* | (2023.01) |
| *H10N 30/853* | (2023.01) |
| *H10N 30/87* | (2023.01) |

(52) U.S. Cl.
CPC ....... *G01S 15/8906* (2013.01); *H10N 30/073* (2023.02); *H10N 30/088* (2023.02); *H10N 30/802* (2023.02); *H10N 30/8554* (2023.02); *H10N 30/875* (2023.02); *H10N 30/877* (2023.02); *B06B 2201/76* (2013.01)

(58) Field of Classification Search
CPC .. H10N 30/073; H10N 30/088; H10N 30/802; H10N 30/875; H10N 30/877; H10N 30/8554
See application file for complete search history.

(56) References Cited

U.S. PATENT DOCUMENTS

| | | | |
|---|---|---|---|
| 5,810,733 A | 9/1998 | Van Creveld et al. | |
| 6,742,248 B2 | 6/2004 | Wong | |
| 6,958,255 B2 | 10/2005 | Khuri-Yakub et al. | |
| 8,764,664 B2* | 7/2014 | Callahan | A61B 8/4263 |
| | | | 600/447 |
| 8,988,971 B2 | 3/2015 | Mueller et al. | |
| 9,741,682 B2 | 8/2017 | Arvin | |
| 9,847,310 B2 | 12/2017 | Seddon | |
| 10,562,069 B2* | 2/2020 | Horsley | H10N 30/2047 |
| 11,638,571 B2* | 5/2023 | Suzuki | A61B 8/461 |
| | | | 600/459 |
| 2003/0235119 A1 | 12/2003 | Wien et al. | |
| 2007/0239001 A1 | 10/2007 | Mehi et al. | |
| 2007/0299345 A1 | 12/2007 | Adachi et al. | |
| 2008/0296708 A1 | 12/2008 | Wodnicki et al. | |
| 2009/0122651 A1 | 5/2009 | Kupnik et al. | |
| 2010/0168583 A1 | 7/2010 | Dausch et al. | |
| 2012/0277639 A1 | 11/2012 | Pollock et al. | |
| 2012/0319303 A1 | 12/2012 | Foster | |
| 2013/0020698 A1 | 1/2013 | Hsieh et al. | |
| 2013/0345567 A1 | 12/2013 | Sudol et al. | |
| 2014/0184027 A1 | 7/2014 | Rice et al. | |
| 2014/0187962 A1 | 7/2014 | Reiter | |
| 2015/0061465 A1 | 3/2015 | Lee et al. | |
| 2015/0087991 A1 | 3/2015 | Chen et al. | |
| 2015/0097468 A1 | 4/2015 | Hajati et al. | |
| 2015/0165479 A1* | 6/2015 | Lasiter | H10N 30/2047 |
| | | | 29/25.35 |
| 2015/0282783 A1 | 10/2015 | Katsura et al. | |
| 2016/0009544 A1 | 1/2016 | Rothberg et al. | |
| 2016/0187301 A1 | 6/2016 | Gu | |
| 2017/0110504 A1* | 4/2017 | Panchawagh | H10N 39/00 |
| 2017/0365774 A1* | 12/2017 | Rothberg | B06B 1/0292 |
| 2018/0003678 A1 | 1/2018 | Rothberg et al. | |
| 2018/0046836 A1* | 2/2018 | Hinger | G01S 7/52079 |
| 2018/0222750 A1 | 8/2018 | Liu et al. | |
| 2019/0015072 A1 | 1/2019 | Deladi et al. | |
| 2019/0178849 A1 | 6/2019 | Abraham et al. | |
| 2021/0086231 A1 | 3/2021 | Bircumshaw et al. | |
| 2021/0088655 A1 | 3/2021 | Bircumshaw et al. | |
| 2021/0153844 A1 | 5/2021 | Fredrick et al. | |

FOREIGN PATENT DOCUMENTS

| | | |
|---|---|---|
| CN | 107768335 A | 3/2018 |
| JP | 2004130138 A | 4/2004 |
| JP | 2012133994 A | 7/2012 |
| JP | 2013-518530 A | 5/2013 |
| JP | 2017-529683 A | 9/2017 |
| JP | 2018029147 A | 2/2018 |
| KR | 20160018235 A | 2/2016 |
| KR | 20170030605 A | 3/2017 |
| KR | 1020170067632 | 6/2017 |
| WO | WO-2008137030 A1 | 11/2008 |
| WO | WO-2016011000 A1 | 1/2016 |
| WO | WO2017/066612 A | 4/2017 |
| WO | WO-2017143307 A1 | 8/2017 |
| WO | WO-2019222116 A1 | 11/2019 |
| WO | WO-2019222118 A1 | 11/2019 |
| WO | WO-2020198257 A1 | 10/2020 |
| WO | WO-2021102127 A1 | 5/2021 |

OTHER PUBLICATIONS

PCT/US2021/056026 International Search Report and Written Opinion dated Jan. 28, 2022.
PCT/US2021/056669 International Search Report and Written Opinion dated Jan. 28, 2022.
Mahn et al. Au—Sn solid-liquid interdiffusion (SLID) bonding for piezoelectric ultrasonic transducers. 2016 IEEE International Ultrasonics Symposium (IUS) Tours (pp. 1-4)(2016).
PCT/US2019/032060 International Search Report and Written Opinion dated Jul. 26, 2019.
PCT/US2019/032062 International Search Report and Written Opinion dated Jul. 29, 2019.
PCT/US2020/061261 International Search Report and Written Opinion dated Feb. 9, 2021.
PCT/US2022/021556 International Search Report and Written Opinion dated Jul. 22, 2022.
PCT/US2022/021556 Invitation to Pay Additional Fees dated May 26, 2022.
Tung (Au—Sn Solid-Liquid Interdiffusion (SLID) bonding for Piezoelectric Ultrasonic Transducers) (Year: 2016).

* cited by examiner

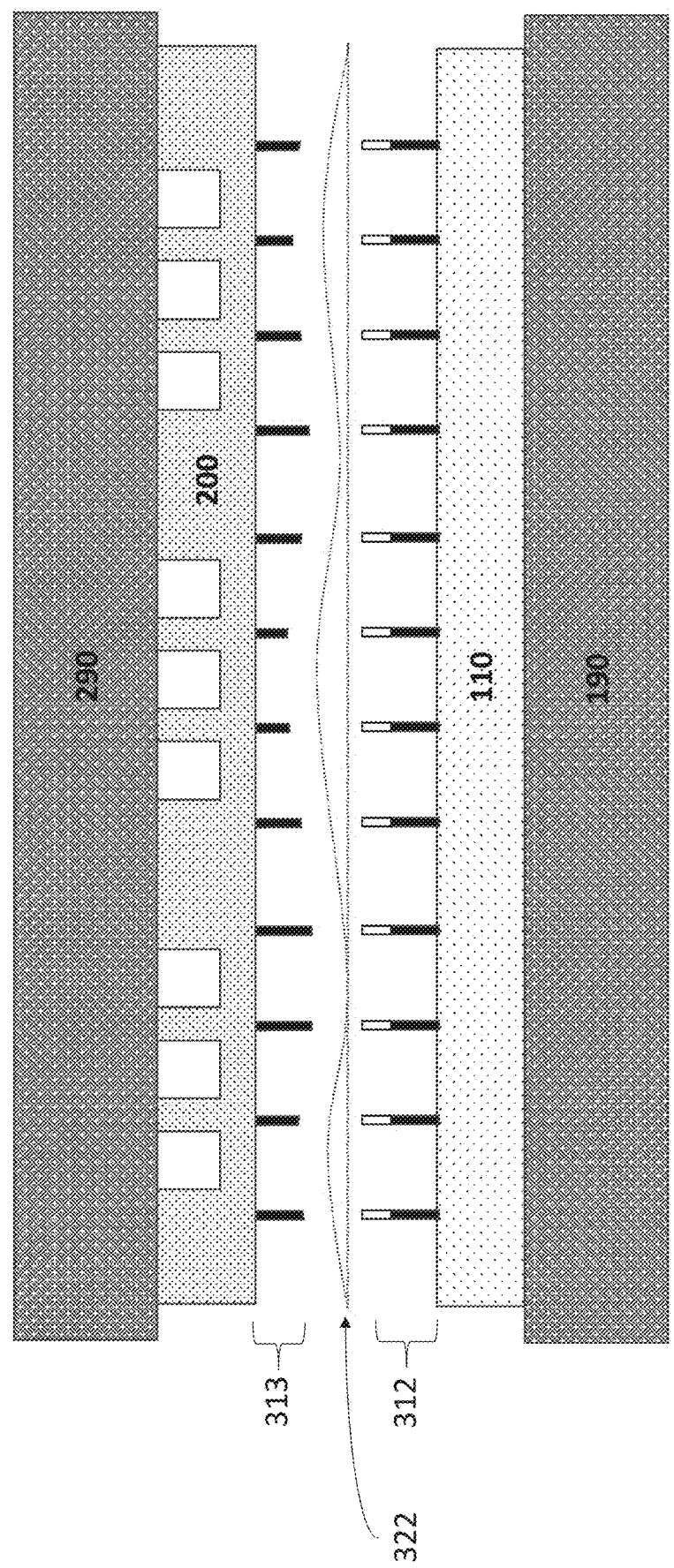

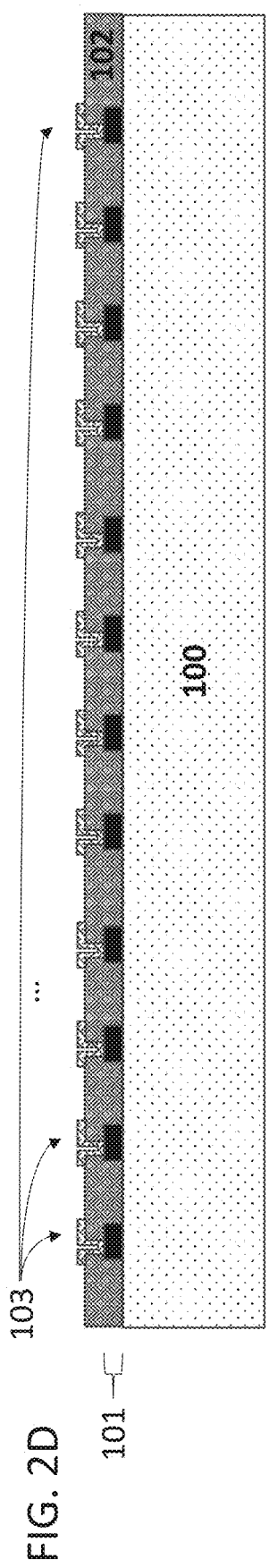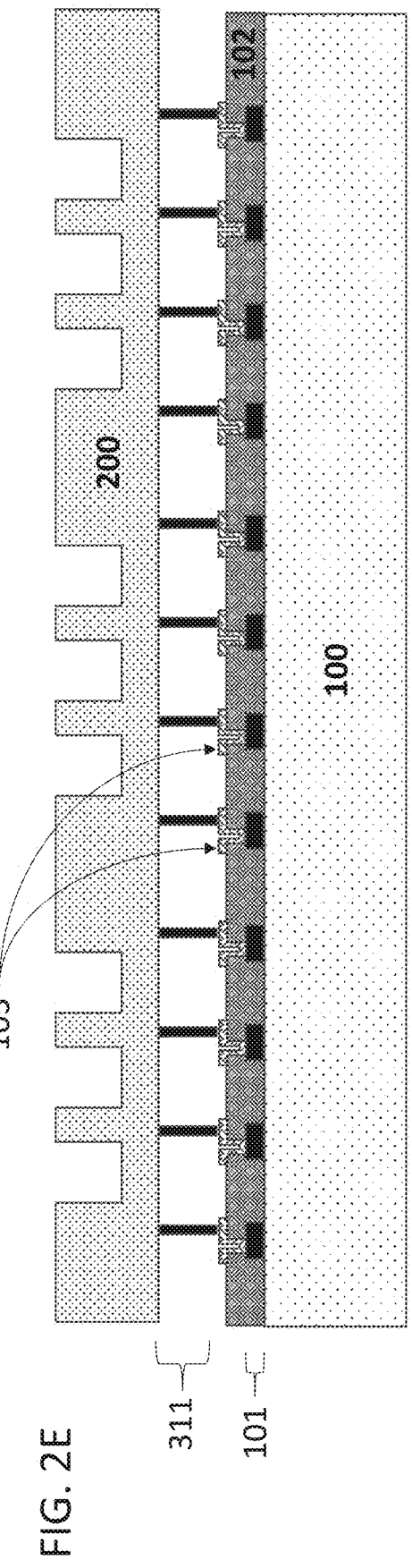

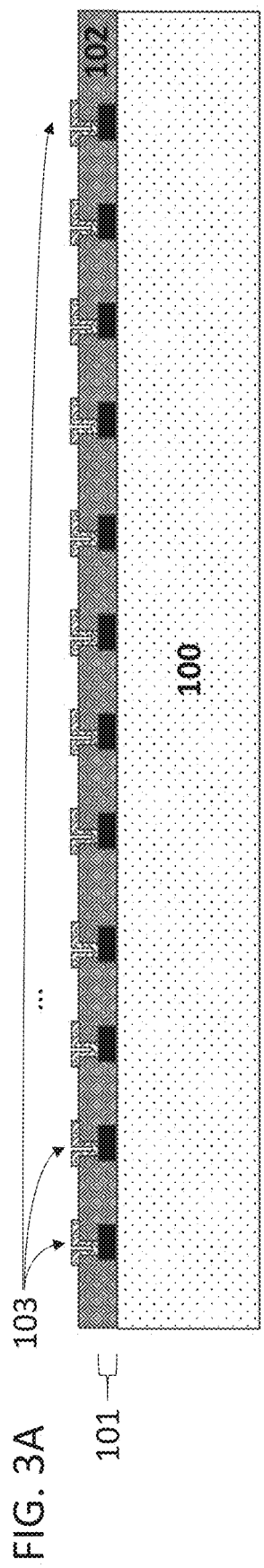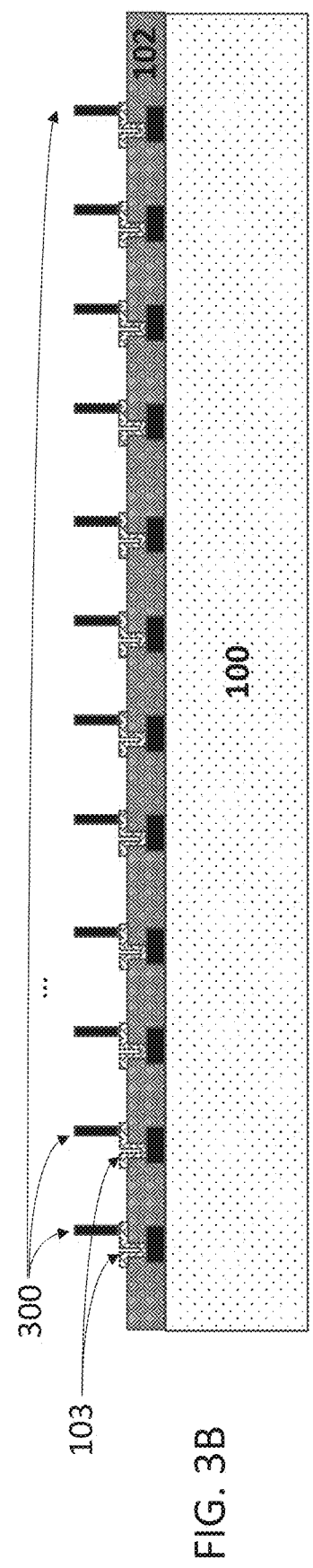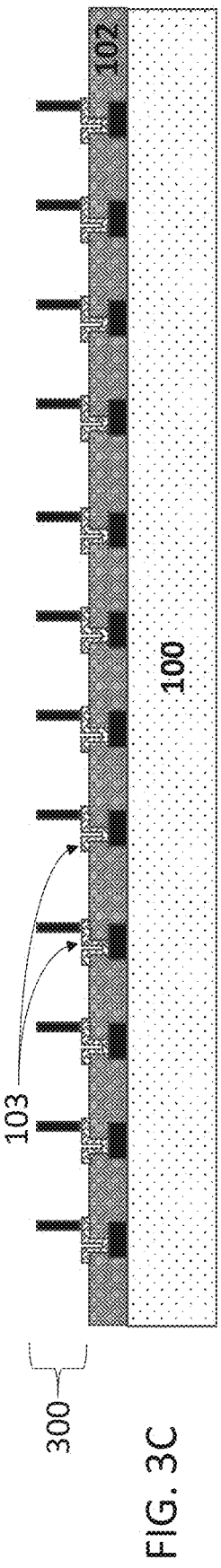

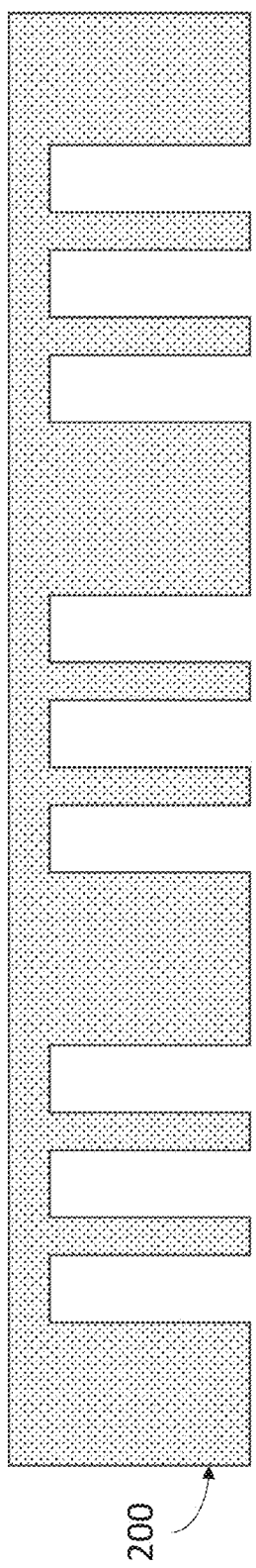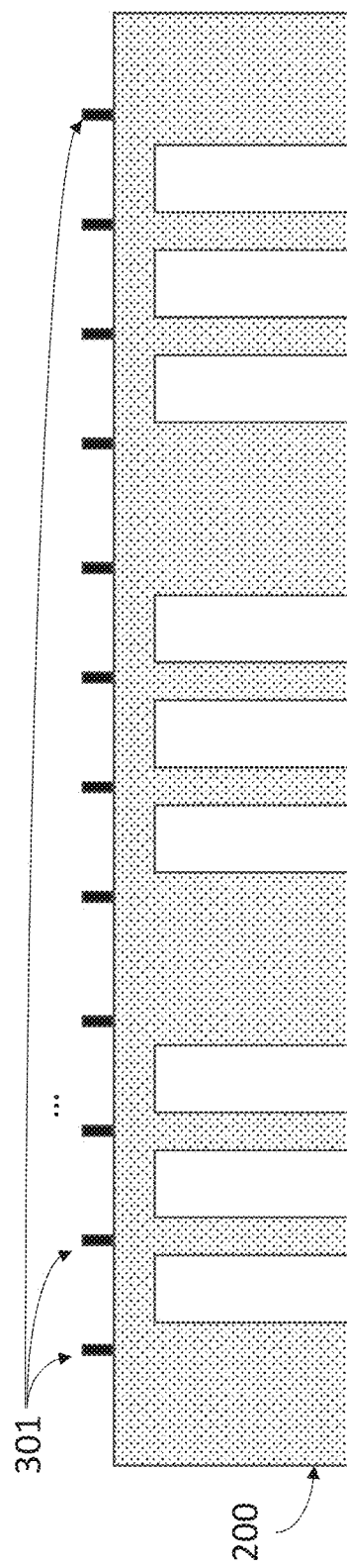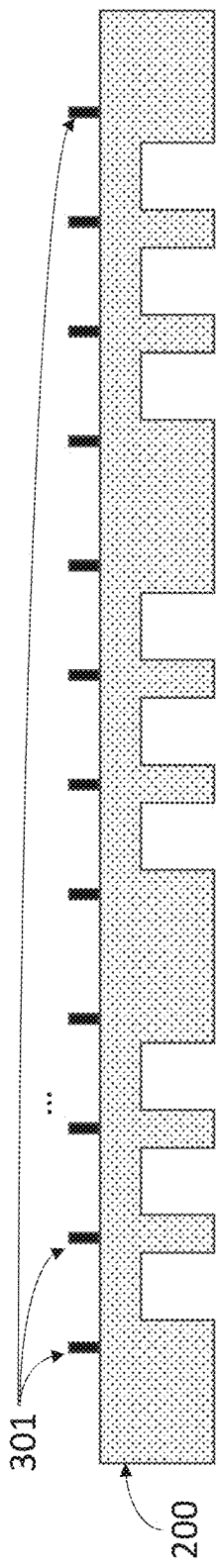

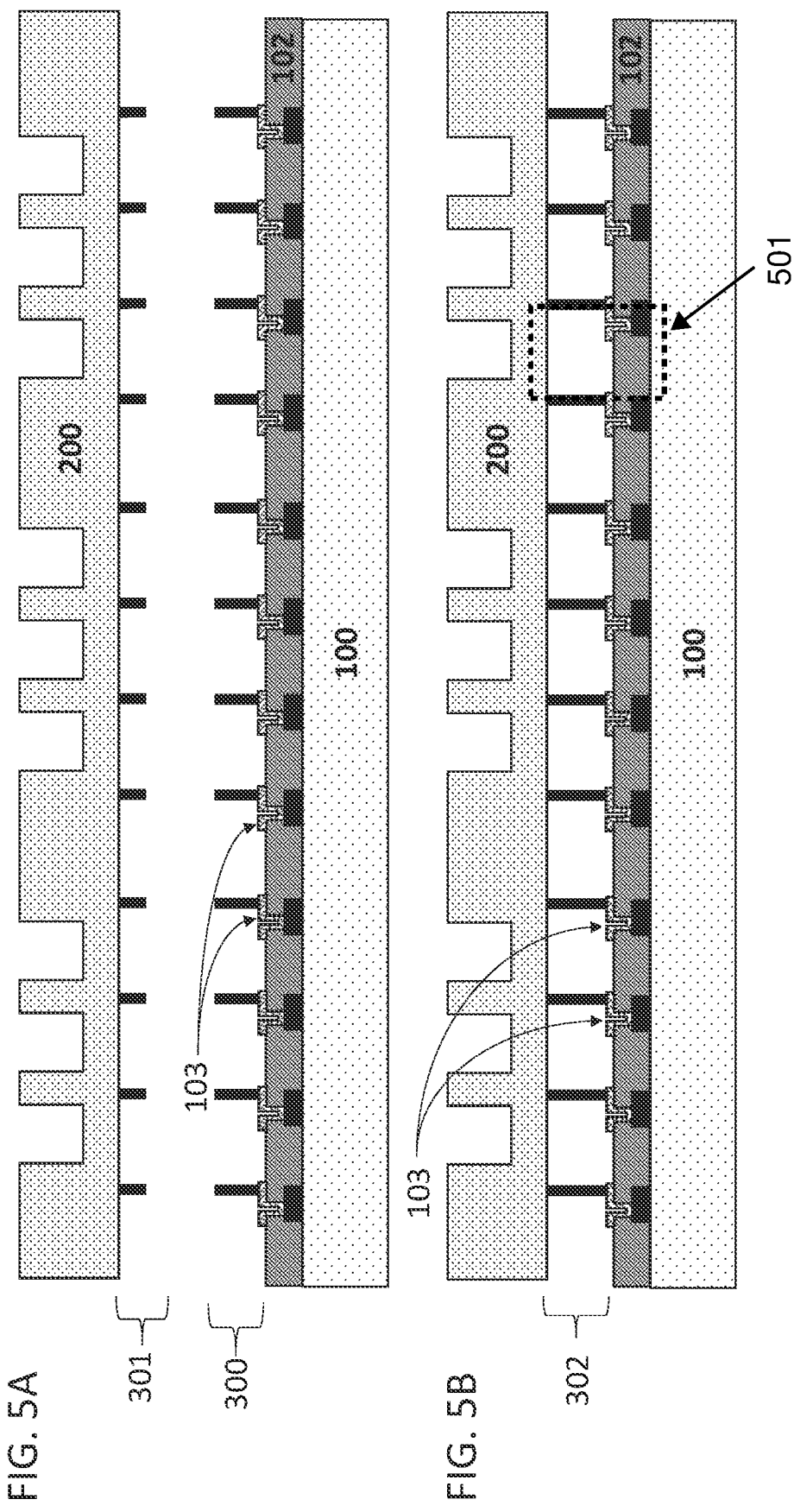

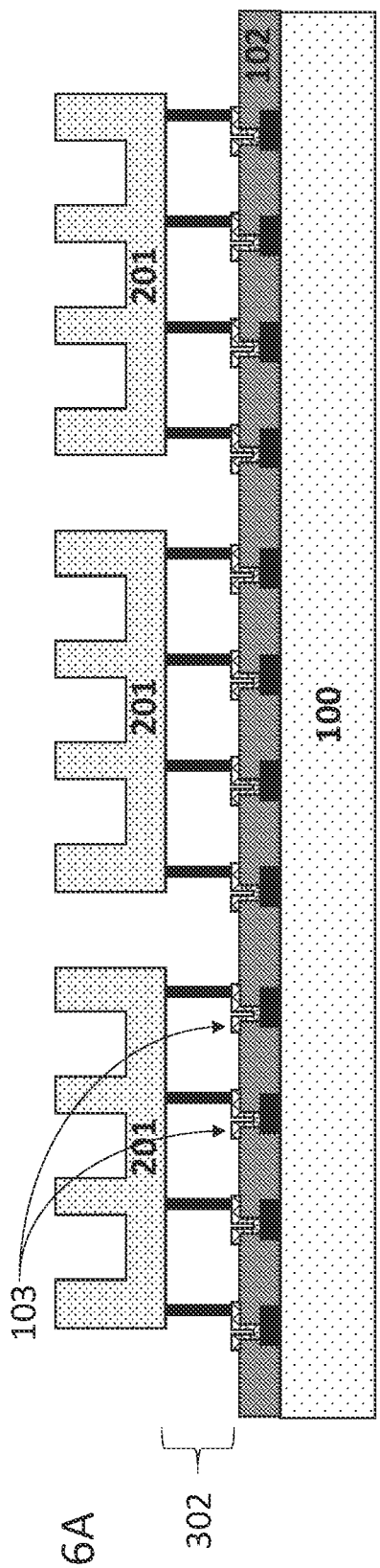
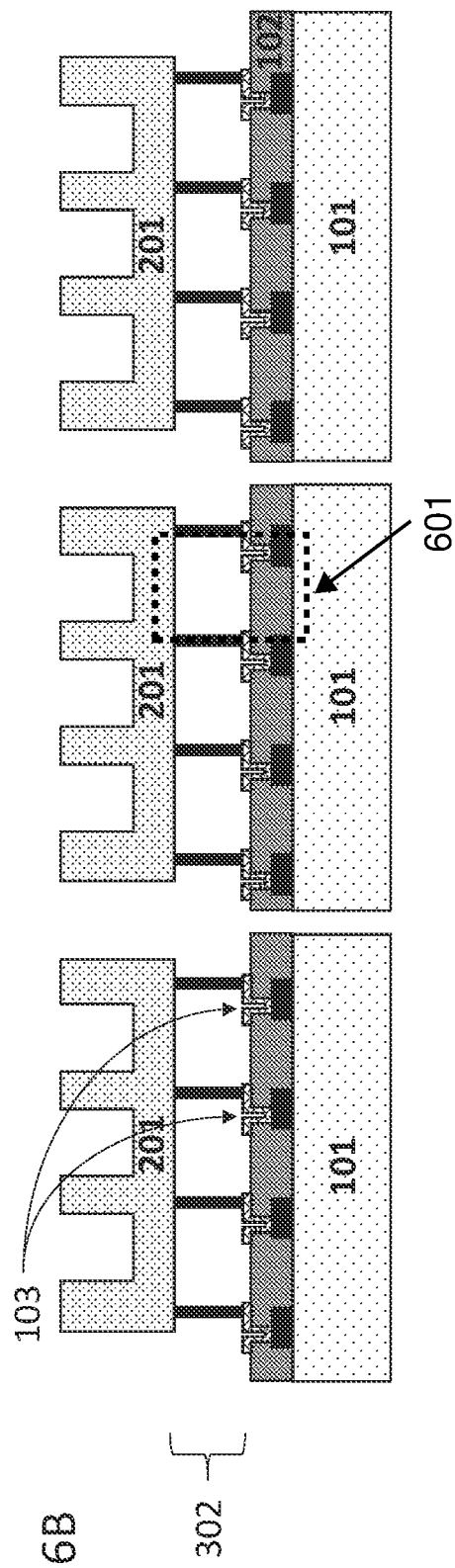
FIG. 6A
FIG. 6B

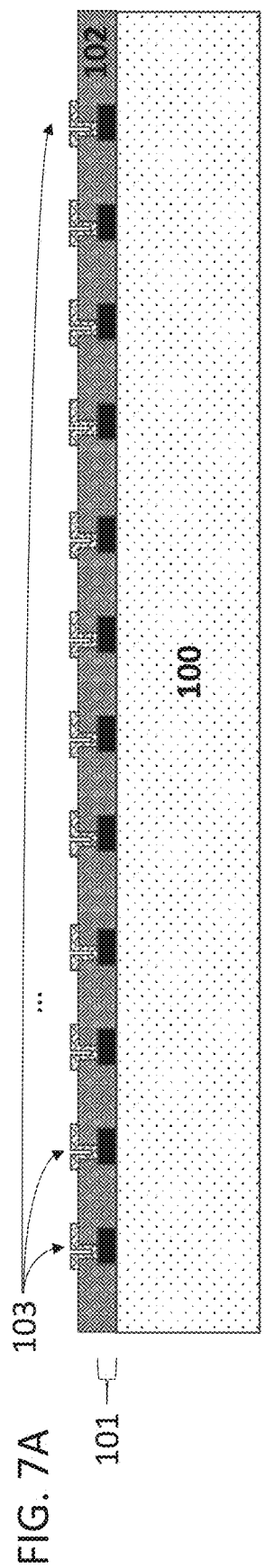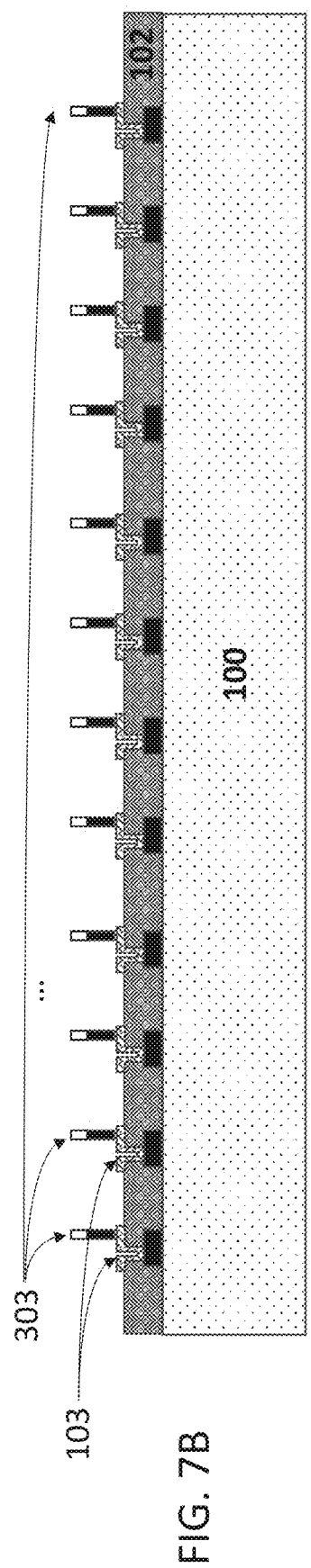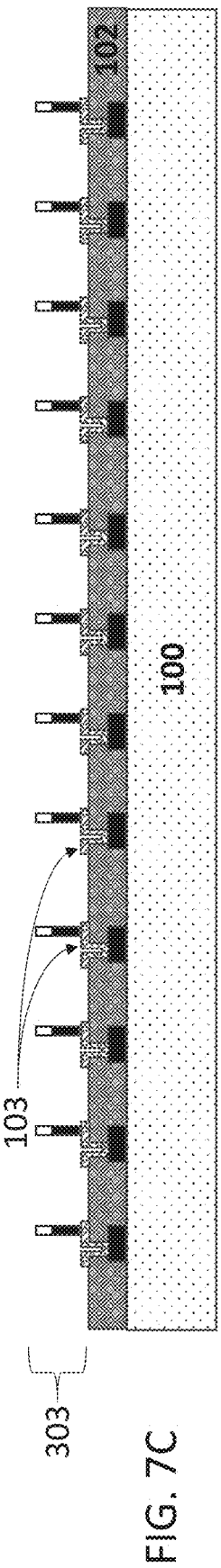

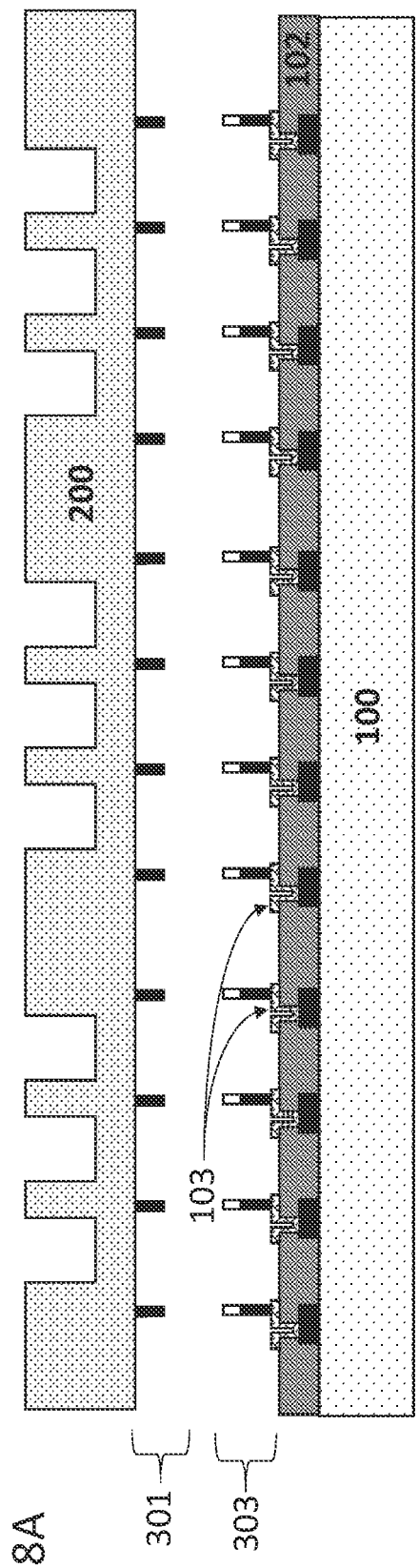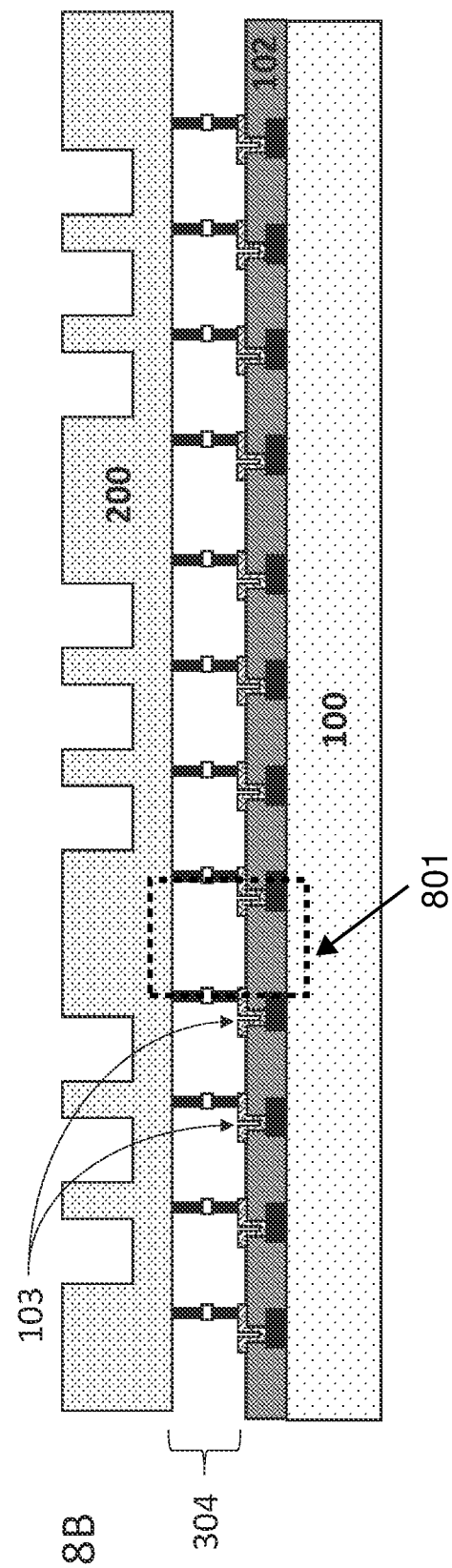

INTEGRATION TECHNIQUES FOR MICROMACHINED PMUT ARRAYS AND ELECTRONICS USING THERMOCOMPRESSION BONDING, EUTECTIC BONDING, AND SOLDER BONDING

CROSS-REFERENCE

This application is a continuation of U.S. Ser. No. 17/095,333, filed Nov. 11, 2020, which is a continuation of PCT/US2019/032062, filed May 13, 2019, which claims the benefit of U.S. Provisional Application No. 62/671,361, filed May 14, 2018, which applications are incorporated herein by reference in their entirety.

BACKGROUND

Piezoelectric micromachined ultrasonic transducer (pMUT) arrays may offer advantages in ultrasonic imaging due to their efficiency in transducing between the electrical and acoustic energy domains. In particular, pMUTs may offer the key advantage of imaging with <10V drive, thereby enabling direct coupling to modern electronic nodes without intermediary electronics. By eliminating high voltage drivers and coupling the circuitry directly to the pMUT arrays, several advantages can be realized, such as reduction of costly and bulky wiring, decreased noise, and reduced overall system cost, power, and/or size.

SUMMARY

The present disclosure provides methods to integrate micromachined piezoelectric micromachined ultrasonic transducer (pMUT) arrays with an application-specific integrated circuit (ASIC) using thermocompression bonding, eutectic bonding, or solder bonding.

The use of thermocompression bonding, eutectic bonding, or solder bonding may offer several advantages for integration, such as, for example, heterogeneous integration, low temperature, low resistance, high-density, high-yield interconnect, superior bond performance, wafer-to-wafer, die-to-wafer, or die-to-die bonding, and environmental control between parts.

In an aspect, the present disclosure provides a device comprising a first substrate and a second substrate, the first substrate comprising at least one piezoelectric micromachined ultrasonic transducer (pMUT) array and the second substrate comprising at least one electrical circuit, wherein the first substrate and the second substrate are bonded together using thermocompression, wherein any set of one or more individual PMUTs of the at least one PMUT array is addressable.

In some embodiments, the pMUT array is configured to perform ultrasound imaging. In some embodiments, the at least one electrical circuit comprises an application-specific integrated circuit (ASIC). In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. The intermediate handle substrate is a temporarily used handle substrate that aids in the fabrication of the final material but does not become part of the final material. A handle substrate may be used temporarily to aid in the processing of wafers, typically making the wafers easier to handle. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using thermocompression. In some embodiments, the bonding comprises die-to-die bonding. In some embodiments, the thermocompression bonding is performed at a temperature of no more than about 350° C. In some embodiments, the thermocompression bonding is performed at a temperature of no more than about 300° C. In some embodiments, the thermocompression bonding forms a hermetic sealed cavity, which cavity is configured to controllably maintain gas species and pressure. In some embodiments, the thermocompression bonding comprises bonding together two metals of the same type selected from the group consisting of gold (Au), copper (Cu), and aluminum (Al).

In another aspect, the present disclosure provides a method of fabricating an integrated device, the method comprising: (a) obtaining a first substrate comprising at least one piezoelectric micromachined ultrasonic transducer (pMUT) array; (b) obtaining a second substrate comprising at least one electrical circuit; and (c) bonding together the first substrate and the second substrate using thermocompression, wherein any set of one or more individual PMUTs of the at least one PMUT array is addressable.

In some embodiments, the pMUT array is configured to perform ultrasound imaging. In some embodiments, the at least one electrical circuit comprises an application-specific integrated circuit (ASIC). In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using thermocompression. In some embodiments, the bonding comprises die-to-die bonding. In some embodiments, the thermocompression bonding is performed at a temperature of no more than about 350° C. In some embodiments, the thermocompression bonding is performed at a temperature of no more than about 300° C. In some embodiments, the thermocompression bonding forms a hermetic sealed cavity, which cavity is configured to controllably maintain gas species and pressure. In some embodiments, the thermocompression bonding comprises bonding together two metals of the same type selected from the group consisting of gold (Au), copper (Cu), and aluminum (Al).

In another aspect, the present disclosure provides a device comprising a first substrate and a second substrate, the first substrate comprising at least one piezoelectric micromachined ultrasonic transducer (pMUT) array and the second substrate comprising at least one electrical circuit, wherein the first substrate and the second substrate are bonded together using eutectic or solder bonding, wherein any set of one or more individual PMUTs of the at least one PMUT array is addressable.

In some embodiments, the pMUT array is configured to perform ultrasound imaging. In some embodiments, the at least one electrical circuit comprises an application-specific integrated circuit (ASIC). In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using eutectic or solder bonding. In some embodiments, the bonding comprises die-to-die bonding. In some embodiments, the eutectic or solder bonding is performed at a temperature of no more than about 350° C. In some embodiments, the eutectic or solder bonding is performed at a temperature of no more than about 300° C. In some embodiments, the eutectic or solder bonding forms a hermetic sealed cavity, which cavity is configured to controllably maintain gas species and pressure. In some embodiments, one or both of the first substrate and the second substrate incorporate at least one feature to limit a flow of a melt of the eutectic or solder bonding. In some embodiments, the eutectic or solder bonding comprises eutectic bonding. In some embodiments, the eutectic bonding comprises bonding together a plurality of different metals selected from the group consisting of aluminum (Al), gold (Au), copper (Cu), germanium (Ge), indium (In), silicon (Si), and tin (Sn). In some embodiments, the plurality of different metals comprises Au—Si, Al—Ge, Au—Sn, Cu—Sn, or Au—In. In some embodiments, the eutectic or solder bonding comprises solder bonding. In some embodiments, the solder bonding comprises bonding using a solder alloy, which solder alloy comprises a plurality of different metals selected from the group consisting of silver (Ag), gold (Au), chromium (Cr), copper (Cu), germanium (Ge), indium (In), manganese (Mn), lead (Pb), silicon (Si), tin (Sn), and zinc (Zn). In some embodiments, the plurality of different metals comprises Au—Sn.

In another aspect, the present disclosure provides a method of fabricating an integrated device, the method comprising: (a) obtaining a first substrate comprising at least one piezoelectric micromachined ultrasonic transducer (pMUT) array; (b) obtaining a second substrate comprising at least one electrical circuit; and (c) bonding together the first substrate and the second substrate using eutectic or solder bonding, wherein any set of one or more individual PMUTs of the at least one PMUT array is addressable.

In some embodiments, the pMUT array is configured to perform ultrasound imaging. In some embodiments, the at least one electrical circuit comprises an application-specific integrated circuit (ASIC). In some embodiments, the bonding comprises wafer-to-wafer bonding. In some embodiments, the bonding comprises die-to-wafer bonding. In some embodiments, the die-to-wafer bonding uses an intermediate handle substrate and a temporary bonding layer. In some embodiments, the bonding comprises: (a) temporarily bonding a wafer of the first substrate or the second substrate to a handle substrate using a temporary bonding layer; (b) dicing the wafer on the handle substrate; and (c) bonding the diced wafer to the other wafer of the first substrate or the second substrate using eutectic or solder bonding. In some embodiments, the bonding comprises die-to-die bonding. In some embodiments, the eutectic or solder bonding is performed at a temperature of no more than about 350° C. In some embodiments, the eutectic or solder bonding is performed at a temperature of no more than about 300° C. In some embodiments, the eutectic or solder bonding forms a hermetic sealed cavity, which cavity is configured to controllably maintain gas species and pressure. In some embodiments, one or both of the first substrate and the second substrate incorporate at least one feature to limit a flow of a melt of the eutectic or solder bonding. In some embodiments, the eutectic or solder bonding comprises eutectic bonding. In some embodiments, the eutectic bonding comprises bonding together a plurality of different metals selected from the group consisting of aluminum (Al), gold (Au), copper (Cu), germanium (Ge), indium (In), silicon (Si), and tin (Sn). In some embodiments, the plurality of different metals comprises Au—Si, Al—Ge, Au—Sn, Cu—Sn, or Au—In. In some embodiments, the eutectic or solder bonding comprises solder bonding. In some embodiments, the solder bonding comprises bonding using a solder alloy, which solder alloy comprises a plurality of different metals selected from the group consisting of silver (Ag), gold (Au), chromium (Cr), copper (Cu), germanium (Ge), indium (In), manganese (Mn), lead (Pb), silicon (Si), tin (Sn), and zinc (Zn). In some embodiments, the plurality of different metals comprises Au—Sn.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIGS. 1A, 1B, and 1C illustrate a "bond zone," in accordance with disclosed embodiments.

FIGS. 2A, 2B, 2C, 2D, and 2E illustrate an ASIC planarization for thermocompression or eutectic/solder bonding, in accordance with disclosed embodiments.

FIGS. 3A, 3B, and 3C illustrate an ASIC preparation for thermocompression bonding, in accordance with disclosed embodiments.

FIGS. 4A, 4B, and 4C illustrate a pMUT array wafer preparation for thermocompression and eutectic/solder bonding, in accordance with disclosed embodiments.

FIGS. 5A and 5B illustrate a thermocompression wafer-to-wafer bonding of a pMUT array and an ASIC, in accordance with disclosed embodiments.

FIGS. 6A and 6B illustrate a singulation of pMUT and ASIC wafers bonded using thermocompression, in accordance with disclosed embodiments.

FIGS. 7A, 7B, and 7C illustrate an ASIC preparation for eutectic/solder bonding, in accordance with disclosed embodiments.

FIGS. 8A and 8B illustrate a eutectic/solder wafer-to-wafer bonding of a pMUT array and an ASIC, in accordance with disclosed embodiments.

DETAILED DESCRIPTION

Figure 1A:
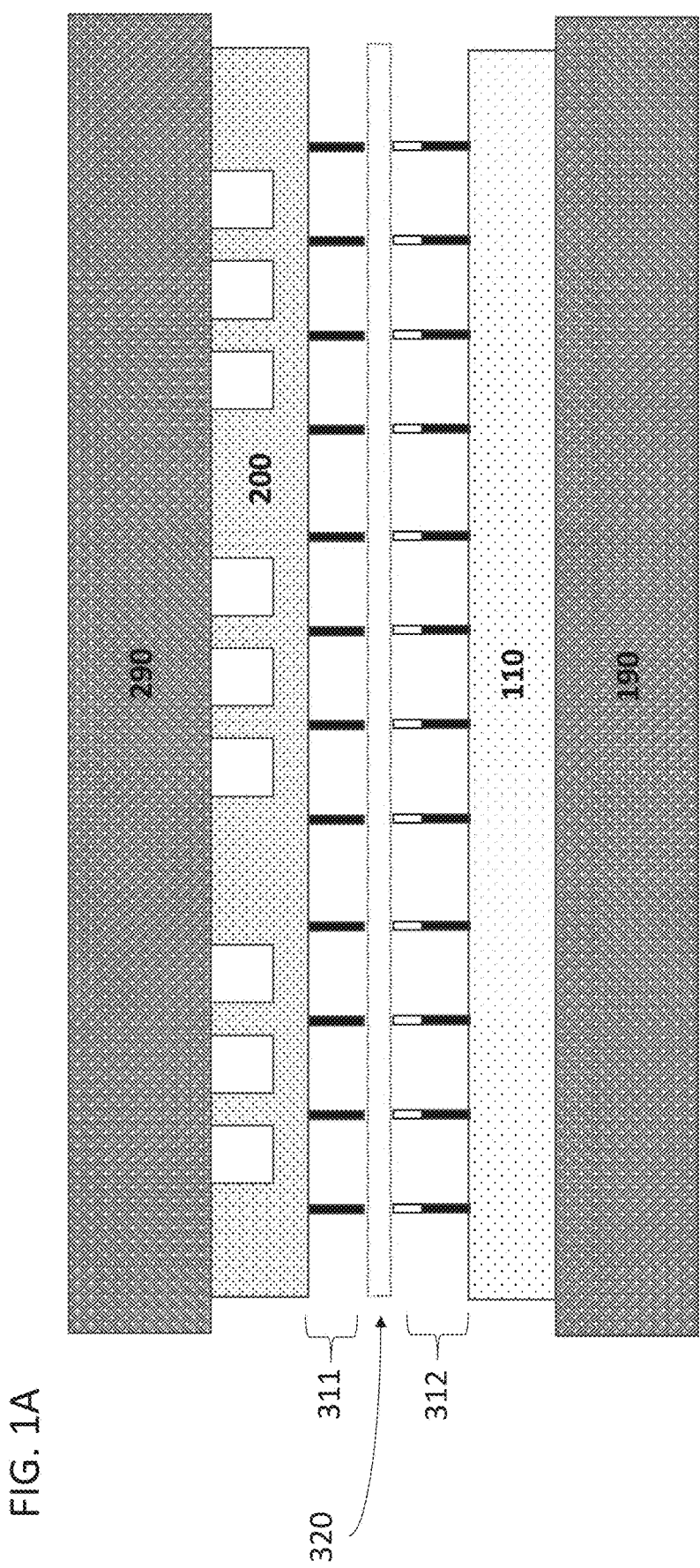

Piezoelectric micromachined ultrasonic transducer (pMUT) arrays may offer advantages in ultrasonic imaging due to their efficiency in transducing between the electrical and acoustic energy domains. In particular, pMUTs may offer the key advantage of imaging with <10V drive, thereby enabling direct coupling to modern electronic nodes without intermediary electronics. By eliminating high voltage drivers and coupling the circuitry directly to the pMUT arrays, several advantages can be realized, such as reduction of costly and bulky wiring, decreased noise, and reduced overall system cost, power, and/or size.

Piezoelectric materials and devices may encounter challenges due to their Curie temperature (Tc). The Tc of a piezoelectric material may vary depending on the specific material, but generally may fall in a range between 80° C. and 400° C. At temperatures below a piezoelectric material's Tc, the piezoelectric material may have a ferroelectric characteristic, which means the piezoelectric material has an asymmetry in its unit cell. Such an asymmetry may lead to a separation of charged constituent ions, such that a dipole is created (e.g., the center of positive charge may be displaced from the center of negative charge). The dipoles may form domains in which all dipoles are pointed in the same direction. Typically, every crystal may have multiple domains, with each domain's dipole moment at 180 degrees or 90 degrees relative to the adjacent domain. Domains separated by a crystal boundary can take on any relative orientation. The process of poling may align the domains within crystals, and the dipoles of different crystals, substantially in one direction.

At temperatures above the Curie temperature, Tc, of a piezoelectric material, the piezoelectric material may have a dielectric characteristic, which means the piezoelectric material loses its piezoelectric effect. This result may occur because the piezoelectric material's unit cell undergoes a phase change from an asymmetric unit cell to one that is symmetric with respect to charge. In other words, at temperatures below Tc, the unit cell has a dipole moment; in contrast, at temperatures above Tc, the unit cell has no dipole moment. For example, lead zirconate titanate ($Pb[Zr_xTi_{1-x}]O_3$, PZT) is a piezoelectric material that, when subjected to a change in temperature from a temperature below Tc to a temperature above Tc, may undergo a phase change from rhombohedral and tetragonal unit cells with dipole moments, to cubic unit cells with no dipole moment.

In such circumstances, the piezoelectric effect of the material may be restored by returning the piezoelectric material to a temperature below Tc. However, the films of the piezoelectric material may be de-poled, thereby reducing their efficiency as a piezoelectric material. In other words, instead of the ferroelectric domains of the piezoelectric material being substantially aligned in one direction, the ferroelectric domains may be randomly aligned or only partially aligned. Poling of the piezoelectric material may be necessary to return the piezoelectric material to optimal performance. Moreover, repeated or prolonged exposure of the piezoelectric material to temperatures above Tc can result in degraded piezoelectric performance.

Recognizing a need for improved methods for integration of piezoelectric devices, the present disclosure provides methods to integrate micromachined piezoelectric micromachined ultrasonic transducer (pMUT) arrays with an application-specific integrated circuit (ASIC) using thermocompression bonding, eutectic bonding, or solder bonding at the wafer level.

Thermocompression bonding may also be referred to as diffusion bonding, pressure joining, and solid-state or thermocompression welding. Thermocompression bonding may comprise bringing two like metals into contact and applying pressure and heat to the metals. Atoms may then be exchanged between the metals through intermolecular diffusion, thereby forming a stable bond. Suitable metals may be chosen for thermocompression bonding, such as metals with high diffusion rates, such as gold (Au), copper (Cu), and aluminum (Al). Each metal may require different temperatures for thermocompression bonding. For example, Cu and Al typically require thermocompression bonding temperatures above 350° C., while Au—Au thermocompression bonding can be performed at temperatures as low as 260° C. Thermocompression bonding using Cu and Al may also require more preparation to remove surface chemistry; in contrast, Au may be more inert and may not require as much surface preparation for thermocompression bonding.

Because there is no liquid formed in the process, thermocompression bonding may advantageously avoid the challenges associated with the occurrence of "squeeze," wherein a bonding liquid may travel far from the bond site by capillary action. Hence, a bond formed by thermocompression bonding may be quite stable upon re-heating and may not substantially change form in response to changes in temperature, unless the melting point of the metal is reached.

Eutectic bonding may refer to a process of bringing two disparate materials into contact and applying pressure and heat to the two materials. Given two materials, material 1 and material 2, suppose that the melting temperatures of the materials are $T_{m1}$ and $T_{m2}$, respectively, and that $T_{m1}<T_{m2}$. Then thermodynamically, any mixture of the two materials is expected to have a melting point below $T_{m2}$. The eutectic temperature, Te, may be defined as the minimum temperature of the two-material system. The eutectic point is lower than the other two melting points, i.e., $Te<T_{m1}<T_{m2}$. During eutectic bonding, the temperature may be raised to a point just above Te. A melted alloy may be created, which may have a constitution based on the temperature of the bond. The eutectic bonding process may continue until a stable alloy mixture is attained for the bonding temperature. The eutectic bond may be susceptible to squeeze, and may change character if the temperature is brought to or above the bond temperature. Common material systems used for eutectic bonding may include Au—Si, Al—Ge, Au—Sn, Cu—Sn, and Au—In. For example, Au—Sn, Cu—Sn, and Au—In may have eutectic temperatures below 300° C.

Solder bonding may refer to a process of placing a fusible metal alloy between two surfaces, applying heat, and forming a bond. Common solder alloys may include two or more of the following materials: silver (Ag), gold (Au), chromium (Cr), copper (Cu), germanium (Ge), indium (In), manganese (Mn), lead (Pb), silicon (Si), tin (Sn), and zinc (Zn). The solder alloy may be designed to melt at a eutectic temperature or at an off-eutectic temperature. As such, eutectic bonding can be considered as a subset of solder bonding. The solder alloys may be chosen to be suitable for temperatures below 300° C. During solder bonding, a liquid is formed, and the bond may be susceptible to squeeze. During squeeze, the solder bond may reflow if the temperature is brought close to the alloy melting temperature, thereby making the bond less stable. A common solder bond may comprise Au—Sn, which may form a eutectic bond in the correct alloy proportions.

In the present disclosure, eutectic bonding and solder bonding may be referred to as "eutectic/solder bonding." Eutectic/solder bonding may advantageously require less force and lower temperatures compared to thermocompression. However, both eutectic bonding and solder bonding may be susceptible to challenges due to squeeze and form a less stable bond than thermocompression.

The use of thermocompression bonding, eutectic bonding, or solder bonding may offer several advantages for integration, including heterogeneous integration, low temperature, low resistance, high-density, high-yield interconnect, superior bond performance, wafer-to-wafer, die-to-wafer, or die-to-die bonding, environmental control between parts, and high-temperature stability.

For example, the use of thermocompression bonding, eutectic bonding, or solder bonding to perform integration of micromachined pMUT arrays and electronics may enable heterogeneous integration by the bonding and interconnecting of two separate dice fabricated using different process techniques. Using methods of the present disclosure, a variety of electronics may be integrated with microelectromechanical systems (MEMS) components.

As another example, the use of thermocompression bonding, eutectic bonding, or solder bonding to perform integration of micromachined pMUT arrays and electronics may be performed at low temperature. For example, gold-gold (Au—Au) thermocompression can be performed at a temperature below 300° C. The majority of solder alloys have melting temperatures around or below 300° C. In particular, performing integration of pMUT arrays and electronics at low temperature may advantageously preserve reliability of the pMUT arrays.

As another example, the use of thermocompression bonding, eutectic bonding, or solder bonding to perform integration of micromachined pMUT arrays and electronics may offer low resistance. To reduce noise and parasitics, an interconnection method may be chosen with a low resistance of no more than about 1 ohm ($\Omega$). Thermocompression bonding, eutectic bonding, and solder bonding all typically utilize metals, or alloys with metals (e.g., Au—Si), thereby producing integrated structures with interconnect resistances of much lower than 1 ohm ($\Omega$).

As another example, the use of thermocompression bonding, eutectic bonding, or solder bonding to perform integration of micromachined pMUT arrays and electronics may offer high-density, high-yield interconnects. Thermocompression bonding, eutectic bonding, and solder bonding all may support interconnect pitches of less than 100 microns ($\mu$m) and hence enable interconnection of a dense array of devices with electronics, which may be necessary, e.g., to fabricate transducer arrays configured for ultrasound imaging. The density of an interconnect using thermocompression bonding may be primarily regulated by the control of the interconnect height based on plating and/or sputter deposition. The yield of an interconnect using thermocompression bonding may be similarly limited by the interconnect height control of the plating. If this interconnect height is controlled, then the yield of the interconnect may be dominated by the defect density. The density of an interconnect using eutectic/solder bonding may be primarily regulated by squeeze and the controls necessary to contain the squeeze. Such controls can also impact the design and performance of the bonded devices.

As another example, the use of thermocompression bonding, eutectic bonding, or solder bonding to perform integration of micromachined pMUT arrays and electronics may offer superior bond performance. Because the thermocompression bond, eutectic bond, and solder bond are based on metals, each of the bonds may have a high mechanical stability and may be capable of a hermetic seal.

As another example, the use of thermocompression bonding, eutectic bonding, or solder bonding to perform integration of micromachined pMUT arrays and electronics may enable different bonding types, including wafer-to-wafer bonding, die-to-wafer bonding, and die-to-die bonding. For example, wafer-to-wafer bonding may be performed with higher throughput and lower cost, while die-to-wafer bonding or die-to-die bonding may be performed to enable the bonding of only known good dice for higher yield.

As another example, the use of thermocompression bonding, eutectic bonding, or solder bonding to perform integration of micromachined pMUT arrays and electronics may enable environmental control between parts. For example, thermocompression bonding, eutectic bonding, and solder bonding all may enable the formation of closed cavities in which the cavity environment can be controlled in terms of gas species and pressure. For example, the gas species and pressure can be tuned for optimal imager performance.

As another example, the use of thermocompression bonding, eutectic bonding, or solder bonding to perform integration of micromachined pMUT arrays and electronics may offer high-temperature stability. Because thermocompression bonding may rely on the solid-state diffusion of atoms across the bond interface without liquid formation, the thermocompression bond may be especially stable to high temperatures and pressures. As a result, the thermocompression bond can be further subjected to one or multiple temperature excursions up to and above the bonding temperature without substantively changing the thermocompression bond. Indeed, the thermocompression bond may remain stable up to the melting temperature of the bond material (e.g., 1064° C. for Au—Au thermocompression bonding). Eutectic bonds and solder bonds may leave unreacted materials, and subsequent temperature excursions can result in changes in the eutectic/solder bond. Therefore, thermocompression bonding may be a preferred method of bonding provided that the system can tolerate the process conditions (e.g., temperatures and pressures) necessary to perform the thermocompression bonding.

The present disclosure provides methods of bonding a piezoelectric micromachined ultrasonic transducer (pMUT) array with electronics (e.g., an application-specific integrated circuit (ASIC)) using thermocompression bonding, eutectic bonding, or solder bonding, to form a dense array of conductive bonds. These techniques may be illustrated by embodiments comprising methods of wafer-to-wafer bonding. Wafer-to-wafer bonding may present advantages of offering the ability to rapidly bond a large number of components, while minimizing extra processing steps, thereby resulting in higher throughput of batch processing and lower cost of integration. Such manufacturing advantages can be critical for high volume and/or low cost. Wafer-to-wafer bonding may also present potential challenges such as 1) compounding of yields of the pMUT array wafer and of the ASIC wafer, 2) alignment errors in the substrates, and 3) a need for the pMUT wafers and ASIC wafers to be designed such that their die sizes match exactly, which can result in wasted wafer area.

In other embodiments, methods of integration using thermocompression bonding, eutectic bonding, and solder bonding may be applicable to die-to-wafer and die-to-die bonding. The die-to-wafer bonding using thermocompression or eutectic/solder bonding may present an advantage of offering an ability to bond only known good dice (KGD), thereby reducing or eliminating challenges related to yield compounding between the ASIC dice and the pMUT dice. This can be performed by placing only KGD pMUT dice onto the handle wafer over KGD ASIC dice. The die-to-wafer bonding using thermocompression or eutectic/solder bonding may also present potential challenges, such as a need for precise handling of thinned dice when attaching them to the handle wafer, and a need for precise pick-and-place equipment for this process. Such constraints may limit throughput of the method for die-to-wafer bonding, thereby resulting in increased manufacturing costs.

The die-to-die bonding using thermocompression or eutectic/solder bonding may present an advantage of offering an ability to have different sizes of the ASIC dice and the pMUT dice. Further, similar to the die-to-wafer bonding using thermocompression or eutectic/solder bonding, the die-to-die bonding using thermocompression or eutectic/solder bonding may present an advantage of offering an ability to bond only known good dice (KGD), thereby reducing or eliminating challenges related to yield compounding between the ASIC dice and the pMUT dice. This can be performed by bonding together only KGD ASIC dice and KGD pMUT dice.

The die-to-die bonding using thermocompression or eutectic/solder bonding may also present potential challenges, such as a need for precise handling of thinned dice when bonding, and a need for a die-to-die bonder equipment for this process. In addition, only one pair of ASIC and pMUT dice can be bonded at a time. Such constraints may limit throughput of the method for die-to-die bonding using thermocompression or eutectic/solder bonding, thereby resulting in increased manufacturing costs.

An integration technique may be chosen among wafer-to-wafer, die-to-wafer, and die-to-die bonding using thermocompression or eutectic/solder bonding based at least in part on factors including specific cost targets, area restrictions, and yields of a given integration process.

By performing methods of the present disclosure, a pMUT (piezoelectric micromachined ultrasonic transducer) array can be bonded with an ASIC (application-specific integrated circuit) using thermocompression bonding or eutectic/solder bonding to form a dense array of conductive bonds, in accordance with various embodiments. In some embodiments, the bonding may comprise wafer-to-wafer bonding using thermocompression bonding. In some embodiments, the bonding may comprise wafer-to-wafer bonding using eutectic/solder bonding. In some embodiments, the bonding may comprise die-to-wafer bonding using thermocompression bonding. In some embodiments, the bonding may comprise die-to-wafer bonding using eutectic/solder bonding. In some embodiments, the bonding may comprise die-to-die bonding using thermocompression bonding. In some embodiments, the bonding may comprise die-to-die bonding using eutectic/solder bonding. As shown in FIG. 6B, the end result of the bonding process may have a pMUT die (201) that is bonded to an ASIC die (101) using a set of one or more conductive bonds (302).

In an aspect, a method of fabricating an integrated device may comprise obtaining a first substrate comprising at least one piezoelectric micromachined ultrasonic transducer (pMUT) device. The pMUT device may be configured to perform ultrasound imaging (e.g., using one or more pMUT transducer arrays). The method of fabricating an integrated device may comprise obtaining a second substrate comprising at least one electrical circuit. The electrical circuit may comprise an application-specific integrated circuit (ASIC). The method of fabricating an integrated device may comprise bonding together the first substrate and the second substrate using thermocompression, wherein any set of one or more individual PMUTs of the at least one PMUT array is addressable.

In another aspect, a method of fabricating an integrated device may comprise obtaining a first substrate comprising at least one piezoelectric micromachined ultrasonic transducer (pMUT) device. The pMUT device may be configured to perform ultrasound imaging (e.g., using one or more pMUT transducer arrays). The method of fabricating an integrated device may comprise obtaining a second substrate comprising at least one electrical circuit. The electrical circuit may comprise an application-specific integrated circuit (ASIC). The method of fabricating an integrated device may comprise bonding together the first substrate and the second substrate using eutectic or solder bonding, wherein any set of one or more individual PMUTs of the at least one PMUT array is addressable.

The thermocompression bonding, eutectic bonding, or solder bonding may comprise bonding together the first substrate and the second substrate using a set of one or more conductive bonding pillars. The conductive bonding pillar may comprise an intermetallic compound. The conductive bonding pillar may have a height of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm, including increments therein. The conductive bonding pillar may have a lateral dimension between about 10 μm and about 100 μm. For example, the conductive bonding pillar may have a lateral dimension of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm, including increments therein.

The thermocompression bonding, eutectic bonding, or solder bonding may comprise bonding together the first substrate and the second substrate using a set of one or more conductive receiver pads or pillars. The conductive receiver pad or pillar may have a height of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10 μm, at least about 5 μm, at least about 4 μm, at least about 3 μm, at least about 2 μm, or at least about 1 μm, including increments therein. The conductive receiver pad or pillar may have a lateral dimension between about 10 μm and about 100 μm. For example, the conductive receiver pad or pillar may have a lateral dimension of at least about 1,000 μm, at least about 500 μm, at least about 100 μm, at least about 90 μm, at least about 80 μm, at least about 70 μm, at least about 60 μm, at least about 50 μm, at least about 40 μm, at least about 30 μm, at least about 20 μm, at least about 10

µm, at least about 5 µm, at least about 4 µm, at least about 3 µm, at least about 2 µm, or at least about 1 µm, including increments therein.

The thermocompression bonding, eutectic bonding, or solder bonding may be performed at a temperature of no more than about 400° C., no more than about 390° C., no more than about 380° C., no more than about 370° C., no more than about 360° C., no more than about 350° C., no more than about 340° C., no more than about 330° C., no more than about 320° C., no more than about 310° C., no more than about 300° C., no more than about 290° C., no more than about 280° C., no more than about 270° C., no more than about 260° C., no more than about 250° C., no more than about 240° C., no more than about 230° C., no more than about 220° C., no more than about 210° C., or no more than about 200° C., including increments therein.

Figure 1B:
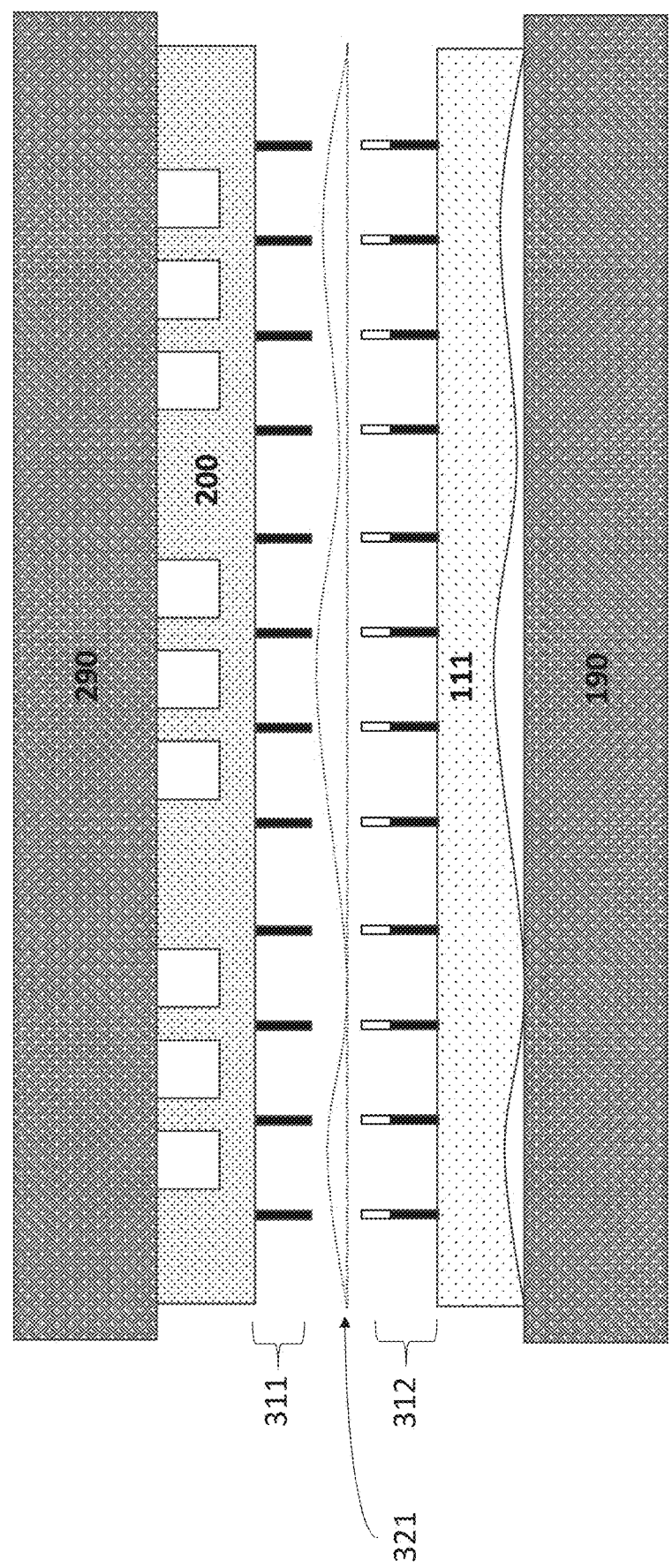

FIGS. 1A, 1B, and 1C illustrate a "bond zone," in accordance with disclosed embodiments. Thermocompression bonding, eutectic bonding, and solder bonding may all require relatively little height variation of the "bond zone." The bond zone can be defined as a volume having a top surface defined by the plane transcribed by the bond points of the top wafer, and a bottom surface defined by the plane transcribed by the bond points of the bottom wafer. For example, consider an exemplary case illustrated in FIG. 1A. Here, the top bond fixture (290) and bottom bond fixture (190) are assumed to be perfectly flat, and that the pMUT wafer (200) and the ASIC wafer (110) have negligible (or zero) total thickness variation (TTV). Further, the conductive bond pillars (312) and conductive receiver pads/pillars (311) are assumed to have uniform thickness. In this case, the bond zone (320) is represented as a cylinder with the diameter of the wafer, and no thickness variation. This is an ideal, or perfect, bond zone. In this illustration, the actual thickness of the bond zone is noted to be negligible and is arbitrarily defined by a choice of coordinate system.

Two primary sources of bond zone thickness variation may include total thickness variation (TTV) of the incoming wafers and variation in the height of the bond pillars. For example, an ASIC Wafer with TTV (111) is illustrated in FIG. 1B. Otherwise, the bond fixtures (190 and 290) are assumed to be perfectly flat, the pMUT wafer (200) is assumed to have no TTV, and the bond pillars (311 and 312) are assumed to be perfectly uniform. In this case, a non-ideal bond zone (321) is created. Similarly, if the conductive receiver pads/pillars are of non-uniform height (313), as illustrated in FIG. 1C, and all other components are assumed to be perfectly flat, with zero TTV, and of uniform height, then a non-ideal bond zone (322) may result as well.

A specification for a tolerable or acceptable thickness variation on a bond zone may be difficult to define, because such thickness variation on a bond zone may depend on many variables, such as bonding equipment, pressure, temperature, TTV of wafers, malleability of bond materials, size of contacts, compliance of wafers and materials, etc. The bond zone thickness variation may be more critical for methods of integration using thermocompression bonding, which may require an intimate contact of solid surfaces. Application of high bond forces can overcome some local bond zone thickness variation, but often may be limited to no more than a few hundred nanometers.

Eutectic bonding or solder bonding may be more tolerable or forgiving thickness variation on a bond zone because a liquid or malleable paste may be created during the bond process. The liquid or malleable paste can deform and overcome a higher degree of local bond zone thickness variation, resulting in a solid bond. The tolerable or acceptable local bond zone thickness variation may be difficult to define, but generally may be on the order of a micron.

Figure 2A:
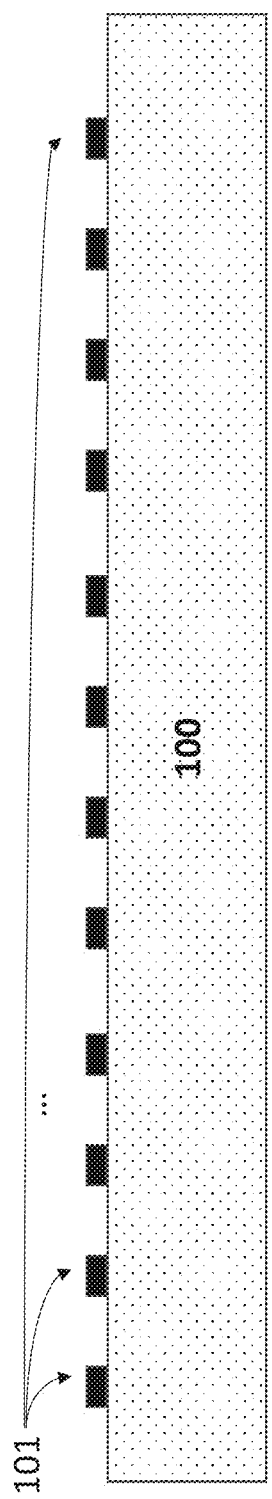
Figure 2B:
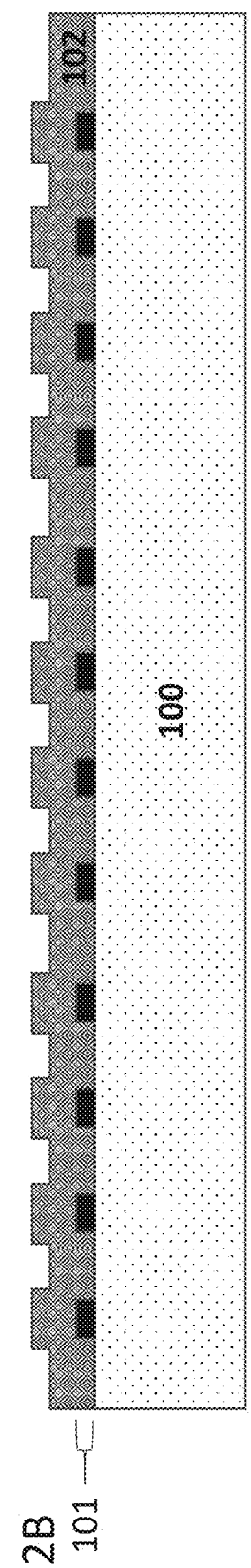
Figure 2C:
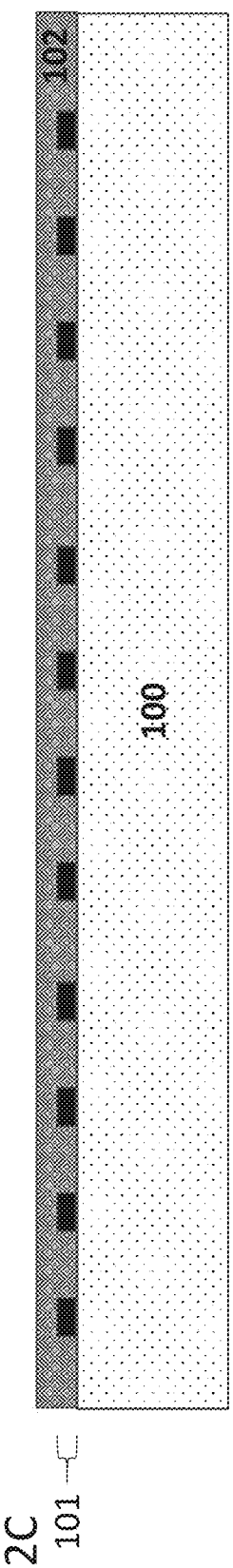

Given the relatively stringent requirements regarding tolerance of bond zone thickness variation, one or both of the incoming wafers may be planarized. The process of planarization is illustrated in FIGS. 2A, 2B, 2C, 2D, and 2E on the ASIC wafer (100). In this representative example, the ASIC wafer (100) has incoming TTV represented by the top metal (101). The source of the TTV may arise not only from the physical top metal of the ASIC wafer, but can also come from wafer TTV and film variations. However, for the purposes of illustration in this example, the top metal (101) may represent all the various TTV components. To planarize the wafer, a thick dielectric (102) such as TEOS is deposited on top of the wafer, as illustrated in FIG. 2B. From FIG. 2B to FIG. 2C, the top surface is subject to a chemical mechanical polish (CMP) to reduce the local thickness variation and produce a flat top surface (which may be flat relative to the incoming height variation). Next, contacts may be opened in the thick dielectric (102), and a connecting conductor (103) may be deposited and patterned, resulting in the structure illustrated in FIG. 2D. The connecting conductor (103) may present a flat surface for good thermocompression bonding, eutectic bonding, or solder bonding to the side of the contact, as illustrated in FIG. 2E.

In addition, this form of planarization can be applied to the pMUT wafer (200) as well. However, doing so may modify the mechanical dynamics of the pMUT array. Adding such planarization may be obvious to those skilled in the art of microfabrication after reviewing FIGS. 2A, 2B, 2C, 2D, and 2E. Careful design of the pMUT wafer (200) and/or the ASIC wafer (100) can obviate a need for planarization. For illustration purposes, the pMUT wafer (200) may be assumed to be designed such that planarization is not needed, while the ASIC wafer (100) may be assumed to be designed such that planarization is required.

After sufficient planarization of the incoming wafers to allow wafer-to-wafer bonding, the planarized incoming wafers may be bonded together using thermocompression bonding or eutectic/solder bonding, as described in the embodiments below.

Wafer-to-Wafer Bonding Using Thermocompression

In an embodiment, the integration of a pMUT array wafer with an ASIC wafer may comprise wafer-to-wafer bonding using thermocompression. FIGS. 3A, 3B, and 3C illustrate an ASIC preparation for thermocompression bonding, in accordance with disclosed embodiments. As illustrated in the cross-section views from FIGS. 3A to 3B, a set of one or more conductive bond pillars (300) are deposited and patterned on an ASIC stack from FIG. 2D comprising the ASIC wafer (100), a top metal (101), a planarized thick dielectric (102), and a connecting conductor (103). The deposition and the patterning of the conductive bond pillars (300) can be performed via a deposition and etch back process or plated using a mold such as photo definable resist ("photoresist").

The conductive bond pillars (300) can be formed using any configuration of materials such that 1) the pillar is conductive (e.g., composed of one or more conductive materials), and 2) the top surface comprises the target thermocompression material to be bonded. For example, for gold-gold (Au—Au) thermocompression, the conductive bond pillars (300) may be formed from solid gold, or may comprise a base of copper (Cu) topped with gold or nickel (Ni) topped with gold and coated with gold externally. The conductive bond pillars (300) can have any suitable height and array configuration. After the conductive bond pillars (300) are formed, the substrate can be thinned as needed, as illustrated in the cross-section views from FIGS. 3B to 3C. For example, a backside thinning process may be used to thin the backside of the ASIC wafer (100) to a desired thickness.

FIGS. 4A, 4B, and 4C illustrate a pMUT array wafer preparation for thermocompression and eutectic/solder bonding, in accordance with disclosed embodiments. As illustrated in the cross-section views from FIGS. 4A to 4B, a set of one or more conductive receiver pads or pillars (301) are deposited and patterned on a pMUT wafer (200), which comprises the pMUT array, or plated using a mold such as a photo resist. The conductive receiver pads or pillars (301) can be formed at the time the pMUT wafer is fabricated.

As with the conductive bond pillars (300) on the ASIC wafer, the conductive receiver pads or pillars (301) can be formed using any configuration of materials such that 1) the pillar is conductive (e.g., composed of one or more conductive materials), and 2) the top surface comprises the target thermocompression material to be bonded. For example, for gold-gold (Au—Au) thermocompression, the conductive receiver pads or pillars (301) may be formed from solid gold, or may comprise a base of copper (Cu) topped with gold or nickel (Ni) topped with gold and coated with gold externally. The conductive receiver pads or pillars (301) can have any suitable height and array configuration. After the conductive receiver pads or pillars (301) are formed, the substrate can be thinned as needed, as illustrated in the cross-section views from FIGS. 4B to 4C. For example, a backside thinning process may be used to thin the backside of the pMUT wafer (200) to a desired thickness.

FIGS. 5A and 5B illustrate a thermocompression wafer-to-wafer bonding of a pMUT array and an ASIC, in accordance with disclosed embodiments. After forming the conductive bond pillars (300) on the ASIC wafer (100) and forming the conductive receiver pillars or pads (301) on the pMUT wafer (200), as illustrated in the cross-section views in FIGS. 5A and 5B, the pMUT wafer (200) is inverted and aligned to the ASIC wafer stack (100, 101, 102, 103, and 300), or vice versa. The two wafers are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars (300) and the conductive receiver pads or pillars (301) to form solid conductive bonds (302) using the thermocompression process, as illustrated in the cross-section views from FIGS. 5A and 5B. The solid conductive bonds (302) may create continuous shells that form sealed structures. Once the two wafers are bonded together, a fully continuous shell may be formed around a cavity, creating a hermetically sealed cavity (501). The materials of, for example, the ASIC wafer (100), the thick dielectric (102), the pMUT wafer (200), and the solid conductive bonds (302) may be designed to be impermeable to certain gasses and liquids, thus forming a hermetically sealed cavity (501). After the solid conductive bonds are formed between the two wafers, the wafer stack can be further processed as needed. For example, the pMUT wafer (200) can be further thinned if desired. For example, a backside thinning process may be used to thin the backside of the pMUT wafer (200) to a desired thickness.

FIGS. 6A and 6B illustrate a singulation of pMUT and ASIC wafers bonded using thermocompression, in accordance with disclosed embodiments. After the solid conductive bonds are formed between the two wafers, the wafers are singulated, one after the other. The solid conductive bonds (302) within the singulated wafers may create continuous shells that form sealed structures. A fully continuous shell may be formed around a cavity, creating a hermetically sealed cavity (601). The materials of, for example, the ASIC wafer (100), the thick dielectric (102), the pMUT wafer (200), and the solid conductive bonds (302) may be designed to be impermeable to certain gasses and liquids, thus forming a hermetically sealed cavity (601). As an example, FIG. 6A illustrates the pMUT wafer (200) from FIG. 5B after being singulated to produce a plurality of pMUT dice (201). Then, the ASIC wafer (100) is singulated from FIGS. 6A to 6B to produce a plurality of ASIC dice (101), thereby completing the method for wafer-to-wafer bonding using thermocompression and obtaining the desired bonded configuration.

In some embodiments, the thermocompression bonding comprises bonding together two metals of the same type selected from the group consisting of gold (Au), copper (Cu), and aluminum (Al).

It will be appreciated that one of skill in the art can use alternatives to the metal configurations for the bond. In the case of Au—Au thermocompression, the process temperature can be dropped to under 300° C., thereby making the bonding process compatible with many piezoelectrics such as pMUT arrays.

Wafer-to-Wafer Bonding Using Eutectic or Solder Bonding

In an embodiment, the integration of a pMUT array wafer with an ASIC wafer may comprise wafer-to-wafer bonding using eutectic or solder bonding. FIGS. 7A, 7B, and 7C illustrate an ASIC preparation for eutectic/solder bonding, in accordance with disclosed embodiments. As illustrated in the cross-section views from FIGS. 7A to 7B, a set of one or more conductive bond pillars with solder (303) are deposited and patterned on an ASIC stack from FIG. 2D comprising the ASIC wafer (100), a top metal (101), a planarized thick dielectric (102), and a connecting conductor (103). The deposition and the patterning of the conductive bond pillars (303) can be performed via a deposition and etch back process or plated using a mold such as a photoresist. Alternatively, for larger conductive bond pillars (303), screen printing can be used to perform the deposition and the patterning of the conductive bond pillars (303) (300).

The conductive bond pillars with solder (303) can be formed using any configuration of materials such that 1) the pillar is conductive (e.g., composed of one or more conductive materials), and 2) the top surface comprises the target solder material to be used. For example, for gold-tin (Au—Sn) solder, the conductive bond pillars with solder (303) may comprise a base of gold (Au) topped with a thinner layer of tin (Sn), or may comprise a base of copper (Cu) topped with thin layers of gold (Au) and tin (Sb), e.g., either single layers or multiple layers of each. The conductive bond pillars with solder (303) can have any suitable height and array configuration. After the conductive bond pillars with solder (303) are formed, the substrate can be thinned as needed, as illustrated in the cross-section views from FIGS. 7B to 7C. For example, a backside thinning process may be used to thin the backside of the ASIC wafer (100) to a desired thickness.

The pMUT array wafer can be prepared for eutectic/solder bonding in a similar manner as that used in thermocompression bonding. As illustrated in the cross-section views from FIGS. 4A to 4B, a set of one or more conductive receiver pads or pillars (301) are deposited and patterned on a pMUT wafer (200), which comprises the pMUT array, or plated using a mold such as a photo resist. After the conductive receiver pads or pillars (301) are formed, the substrate can be thinned as needed, as illustrated in the cross-section views from FIGS. 4B to 4C. For example, a backside thinning process may be used to thin the backside of the pMUT wafer (200) to a desired thickness.

For eutectic/solder bonding, the conductive receiver pads or pillars (301) can be formed using any configuration of materials such that 1) the pillar is conductive (e.g., composed of one or more conductive materials). The conductive receiver pads or pillars (301) can comprise, for example, gold (Au), copper (Cu), nickel (Ni), or aluminum (Al). Alternatively, the conductive receiver pads or pillars (301) can comprise, for example, a semiconductor-like conductive material such as poly-silicon (poly-Si) or poly-germanium (poly-Ge). Optionally, solder can be added to the top of the conductive receiver pads/pillars (301).

FIGS. 8A and 8B illustrate a eutectic/solder wafer-to-wafer bonding of a pMUT array and an ASIC, in accordance with disclosed embodiments. After forming the conductive bond pillars (300) on the ASIC wafer (100) and forming the conductive receiver pillars or pads (301) on the pMUT wafer (200), as illustrated in the cross-section views in FIGS. 8A and 8B, the pMUT wafer (200) is inverted and aligned to the ASIC wafer stack (100, 101, 102, 103, and 303), or vice versa. The two wafers are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars with solder (303) and the conductive receiver pads or pillars (301) to form solid conductive bonds (304) using the eutectic/solder process, as illustrated in the cross-section views from FIGS. 8A and 8B. In the case of eutectic/solder bonding, the conductive bonds (304) may be formed from distinct material sets with an alloyed material forming the bond in the center. One or both of the pMUT wafer (200) and the ASIC wafer stack (100, 101, 102, 103, and 303) may incorporate a feature to limit a flow of a melt of the eutectic or solder bonding. The conductive bonds (304) may create continuous shells that form sealed structures. Once the two wafers are bonded together, a fully continuous shell may be formed around a cavity, creating a hermetically sealed cavity (801). The materials of, for example, the ASIC wafer (100), the thick dielectric (102), the pMUT wafer (200), and the conductive bonds (304) may be designed to be impermeable to certain gasses and liquids, thus forming a hermetically sealed cavity (801). After the solid conductive bonds are formed between the two wafers, the wafer stack can be further processed as needed. For example, the pMUT wafer (200) can be further thinned if desired. For example, a backside thinning process may be used to thin the backside of the pMUT wafer (200) to a desired thickness.

Figure 9A:
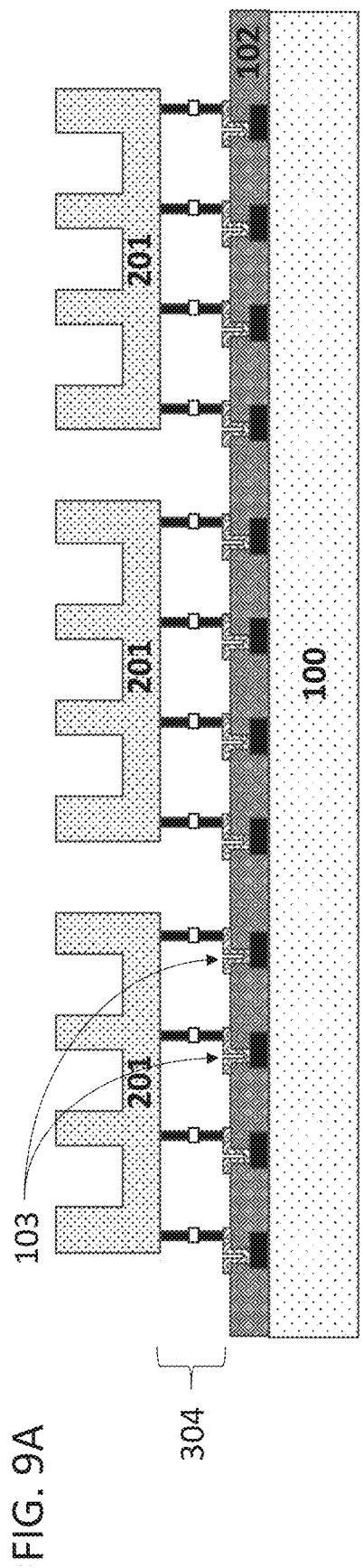
FIGS. 9A and 9B illustrate a singulation of pMUT and ASIC wafers bonded via eutectic/solder bonding, in accordance with disclosed embodiments.
Figure 9B:
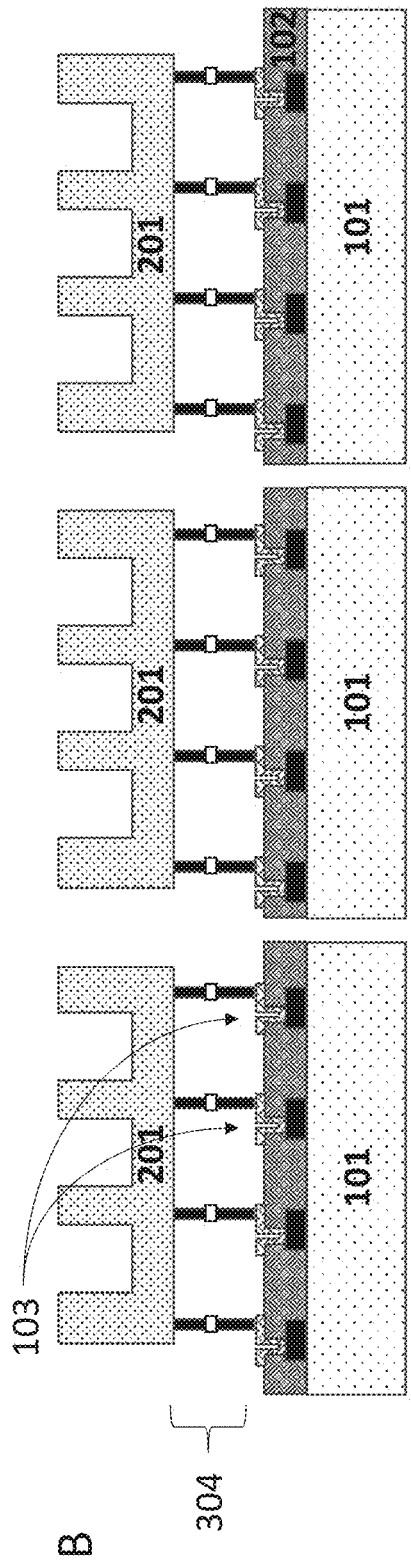

FIGS. 9A and 9B illustrate a singulation of pMUT and ASIC wafers bonded via eutectic/solder bonding, in accordance with disclosed embodiments. After the solid conductive bonds are formed between the two wafers, the wafers are singulated, one after the other. As an example, FIG. 9A illustrates the pMUT wafer (200) from FIG. 8B after being singulated to produce a plurality of pMUT dice (201). Then, the ASIC wafer (100) is singulated from FIGS. 9A to 9B to produce a plurality of ASIC dice (101), thereby completing the method for wafer-to-wafer bonding using the eutectic/solder process and obtaining the desired bonded configuration.

During the eutectic/solder bonding process, the eutectic/solder material may form a liquid or malleable paste. At this point, the eutectic/solder material can squeeze and cause shorting or other problems. Features can be added to the ASIC and/or pMUT wafers to contain such squeeze; for example, shallow trenches or add metal traces can be used around each bond pillar (not shown). This can increase yield and allow smaller pitch patterns.

In some embodiments, the eutectic bonding comprises bonding together a plurality of different metals selected from the group consisting of aluminum (Al), gold (Au), copper (Cu), germanium (Ge), indium (In), silicon (Si), and tin (Sn). For example, the plurality of different metals may comprise Au—Si, Al—Ge, Au—Sn, Cu—Sn, or Au—In.

In some embodiments, the solder bonding comprises bonding using a solder alloy. For example, the solder alloy may comprise a plurality of different metals selected from the group consisting of silver (Ag), gold (Au), chromium (Cr), copper (Cu), germanium (Ge), indium (In), manganese (Mn), lead (Pb), silicon (Si), tin (Sn), and zinc (Zn). For example, the plurality of different metals may comprise Au—Sn.

It will be appreciated that one of skill in the art can use alternatives to the specific arrangement of conductive bond pillars and eutectic/solder material, which may not be critical, so long as the eutectic/solder material is located at the interface of the bond. For example, the eutectic/solder material may be applied to the pMUT wafer instead of the ASIC wafer. Alternatively, the eutectic/solder material may be applied to both the pMUT wafer and the ASIC wafer.

Die-to-Wafer Bonding Using Thermocompression or Eutectic/Solder Bonding

In an embodiment, the integration of a pMUT array wafer with an ASIC wafer may comprise die-to-wafer bonding using thermocompression or eutectic/solder bonding. The die-to-wafer bonding may comprise bonding a plurality of pMUT dice to a single ASIC wafer using thermocompression or eutectic/solder bonding. Alternatively, the die-to-wafer bonding may comprise bonding a plurality of ASIC dice to a single pMUT wafer using thermocompression or eutectic/solder bonding.

The die-to-wafer bonding using thermocompression or eutectic/solder bonding may comprise preparing the ASIC wafer (100) as described in FIGS. 3A, 3B, and 3C. A set of one or more conductive bond pillars (300) may be deposited and patterned on an ASIC stack from FIG. 2D comprising the ASIC wafer (100), a top metal (101), a planarized thick dielectric (102), and a connecting conductor (103). The deposition and the patterning of the conductive bond pillars (300) can be performed via a deposition and etch back process or plated using a mold such as a photoresist. After the conductive bond pillars (300) are formed, the ASIC wafer (100) can be thinned as needed.

The pMUT wafer (200) from FIG. 4C may be singulated to produce a plurality of individual pMUT dice. The plurality of individual pMUT dice may be arranged on a handle substrate with a temporary bonding layer. The arrangement may mirror that of the ASIC dice (101) on the ASIC wafer (100).

The ASIC wafer (100) and the plurality of pMUT dice with handle substrate and temporary bonding layer are aligned together, the fabrication atmosphere conditions (e.g., gases, temperature, and/or pressure) are adjusted as necessary, and the wafers are brought into contact. To form a sufficient intimate contact to promote bonding, pressure is applied to the contacting wafers. The wafers are brought up to a temperature suitable for the conductive bond pillars (300) and the conductive receiver pads or pillars (301) to form solid conductive bonds (300) using thermocompression or eutectic/solder bonding.

After the solid conductive bonds are formed between the two wafers, the handle substrate and temporary bonding layer are removed. The wafer stack can then be further processed as needed. For example, either or both of the pMUT dice or the ASIC wafer (100) can be further thinned if desired. After the solid conductive bonds are formed between the two wafers, the ASIC wafer (100) is singulated to produce a plurality of ASIC dice, thereby completing the bonding process and obtaining the desired bonded configuration. As shown in FIG. 6B, the end result of the bonding process may have a pMUT die (201) that is bonded to an ASIC die (101) using a set of one or more conductive bonds (302).

The die-to-wafer bonding may present an advantage of offering an ability to bond only known good dice (KGD), thereby reducing or eliminating challenges related to yield compounding between the ASIC dice and the pMUT dice. This can be performed by placing only KGD pMUT dice onto the handle wafer over KGD ASIC dice.

The die-to-wafer bonding using thermocompression or eutectic/solder bonding may also present potential challenges, such as a need for precise handling of thinned dice when attaching them to the handle wafer, and a need for precise pick-and-place equipment for this process. Such constraints may limit throughput of the method for die-to-wafer bonding, thereby resulting in increased manufacturing costs.

Die-to-Die Bonding Using Thermocompression or Eutectic/Solder Bonding

In an embodiment, the integration of a pMUT array wafer with an ASIC wafer may comprise die-to-die bonding using thermocompression or eutectic/solder bonding. The die-to-wafer bonding using thermocompression or eutectic/solder bonding may comprise bonding a plurality of pMUT dice to a plurality of ASIC dice using thermocompression or eutectic/solder bonding. The die-to-wafer bonding using thermocompression or eutectic/solder bonding may comprise preparing the ASIC wafer (100) as described in FIGS. 3A, 3B, and 3C. A set of one or more conductive bond pillars (300) may be deposited and patterned on an ASIC stack from FIG. 2D comprising the ASIC wafer (100), a top metal (101), a planarized thick dielectric (102), and a connecting conductor (103). The deposition and the patterning of the conductive bond pillars (300) can be performed via a deposition and etch back process or plated using a mold such as a photoresist. After the conductive bond pillars (300) are formed, the ASIC wafer (100) can be thinned as needed.

The die-to-die bonding using thermocompression or eutectic/solder bonding may comprise preparing the pMUT wafer (200) as described in FIGS. 4A, 4B, and 4C. A set of one or more conductive receiver pads or pillars (301) are deposited and patterned on a pMUT wafer (200) or plated using a mold such as a photoresist. The conductive receiver pads or pillars (301) can have any suitable height and array configuration. The conductive receiver pads or pillars (301) can be formed at the time the pMUT wafer is fabricated. After the conductive receiver pads or pillars (301) are formed, the substrate can be thinned as needed, as illustrated in the cross-section views from FIGS. 4B to 4C. For example, a backside thinning process may be used to thin the backside of the pMUT wafer (200) to a desired thickness.

After forming the conductive bond pillars on the ASIC wafer and forming the conductive receiver pillars or pads on the pMUT wafer, the ASIC wafer and the pMUT wafer may be separately singulated to produce a plurality of ASIC dice with conductive bond pillars and a plurality of pMUT dice with conductive receiver pads or pillars, respectively. After singulating the ASIC wafer and the pMUT wafer, the plurality of ASIC dice and the plurality of pMUT dice are aligned together, the fabrication atmosphere conditions (e.g., gases, temperature, and/or pressure) are adjusted as necessary, and the dice are brought into contact. To form a sufficient intimate contact to promote bonding, pressure is applied to the contacting ASIC dice and pMUT dice. The ASIC dice and the pMUT dice are brought up to a temperature suitable for the conductive bond pillars (300) and the conductive receiver pads or pillars (301) to form solid conductive bonds (300) using thermocompression or eutectic/solder bonding, thereby completing the method for die-to-die bonding and obtaining the desired bonded configuration. As shown in FIG. 6B, the end result of the bonding process may have a pMUT die (201) that is bonded to an ASIC die (101) using a set of one or more conductive bonds (302).

The die-to-die bonding using thermocompression or eutectic/solder bonding may present an advantage of offering an ability to have different sizes of the ASIC dice and the pMUT dice. Further, similar to the die-to-wafer bonding using thermocompression or eutectic/solder bonding, the die-to-die bonding using thermocompression or eutectic/solder bonding may present an advantage of offering an ability to bond only known good dice (KGD), thereby reducing or eliminating challenges related to yield compounding between the ASIC dice and the pMUT dice. This can be performed by bonding together only KGD ASIC dice and KGD pMUT dice.

The die-to-die bonding using thermocompression or eutectic/solder bonding may also present potential challenges, such as a need for precise handling of thinned dice when bonding, and a need for a die-to-die bonder equipment for this process. In addition, only one pair of ASIC and pMUT dice can be bonded at a time. Such constraints may limit throughput of the method for die-to-die bonding using thermocompression or eutectic/solder bonding, thereby resulting in increased manufacturing costs.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A device comprising a first substrate and a second substrate, the first substrate comprising at least one piezoelectric micromachined ultrasonic transducer (pMUT) array having a plurality of pMUTs, the second substrate comprising a plurality of electrical circuits, wherein the first substrate and the second substrate are bonded together using eutectic or solder bonding to form individual electrical connections on a one-to-one basis between each of the plurality of pMUTs of the first substrate and a respective one of the plurality of electrical circuits of the second substrate, wherein the individual electrical connections enable each pMUT to be individually addressable by the respective electrical circuit for facilitating control over each pMUT of the at least one pMUT array.

2. The device according to claim 1, wherein the at least one pMUT array is configured to perform ultrasound imaging.

3. The device according to claim 1, wherein the plurality of electrical circuits comprises an application-specific integrated circuit (ASIC).

4. The device according to claim 1, wherein the first substrate comprises a wafer and the second substrate comprises a wafer, and wherein the first substrate and the second substrate are bonded together using eutectic or solder bonding to create a wafer-to-wafer bond.

5. The device according to claim 1, wherein one of the first substrate or the second substrate comprises a die and one of the first substrate or second substrate comprises a wafer and the first substrate and the second substrate are bonded together using eutectic or solder bonding to create a die-to-wafer bond.

6. The device according to claim 1, wherein the first substrate comprises a die and the second substrate comprises a die and the first substrate and the second substrate are bonded together using eutectic or solder bonding to create a die-to-die bond.

7. The device according to claim 1, wherein the eutectic or solder bonding is performed at a temperature of no more than about 350° C.

8. The device according to claim 7, wherein the eutectic or solder bonding is performed at a temperature of no more than about 300° C.

9. The device according to claim 7, wherein the eutectic or solder bonding comprises eutectic bonding.

10. The device according to claim 9, wherein the eutectic bonding comprises bonding together a plurality of different metals selected from the group consisting of aluminum (Al), gold (Au), copper (Cu), germanium (Ge), indium (In), silicon (Si), and tin (Sn).

11. The device according to claim 10, wherein the plurality of different metals comprises Au—Si, Al—Ge, Au—Sn, Cu—Sn, or Au—In.

12. The device according to claim 7, wherein the eutectic or solder bonding comprises solder bonding.

13. The device according to claim 12, wherein the solder bonding comprises bonding using a solder alloy, which solder alloy comprises a plurality of different metals selected from the group consisting of silver (Ag), gold (Au), chromium (Cr), copper (Cu), germanium (Ge), indium (In), manganese (Mn), lead (Pb), silicon (Si), tin (Sn), and zinc (Zn).

14. The device according to claim 13, wherein the plurality of different metals comprises Au—Sn.

15. A method of fabricating an integrated device, the method comprising:
(a) obtaining a first substrate comprising at least one piezoelectric micromachined ultrasonic transducer (pMUT) array having a plurality of pMUTs;
(b) obtaining a second substrate comprising a plurality of electrical circuits; and
(c) bonding together the first substrate and the second substrate using eutectic or solder bonding to form an individual electrical connection between each pMUT of the first substrate and a respective electrical circuit of the second substrate, wherein the individual electrical connection enables each pMUT of the at least one pMUT array to be individually addressable by the respective electrical circuit for facilitating control over each pMUT of the at least one pMUT array.

16. The method according to claim 15, wherein the at least one pMUT array is configured to perform ultrasound imaging.

17. The method according to claim 15, wherein the plurality of electrical circuits comprises an application-specific integrated circuit (ASIC).

18. The method according to claim 15, wherein the eutectic or solder bonding comprises wafer-to-wafer bonding.

19. The method according to claim 15, wherein the eutectic or solder bonding comprises die-to-wafer bonding.

20. The method according to claim 19, wherein the die-to-wafer bonding uses an intermediate handle substrate and a temporary bonding layer.

21. The method according to claim 15, wherein the eutectic or solder bonding comprises:
(a) temporarily bonding a wafer of the first substrate or the second substrate to a handle substrate using a temporary bonding layer;
(b) dicing the wafer on the handle substrate; and
(c) bonding the diced wafer to the other wafer of the first substrate or the second substrate using eutectic or solder bonding.

22. The method according to claim 15, wherein the eutectic or solder bonding comprises die-to-die bonding.

23. The method according to claim 15, wherein the eutectic or solder bonding is performed at a temperature of no more than about 350° C.

24. The method according to claim 23, wherein the eutectic or solder bonding is performed at a temperature of no more than about 300° C.

25. The method according to claim 23, wherein the eutectic or solder bonding comprises eutectic bonding.

26. The method according to claim 25, wherein the eutectic bonding comprises bonding together a plurality of different metals selected from the group consisting of aluminum (Al), gold (Au), copper (Cu), germanium (Ge), indium (In), silicon (Si), and tin (Sn).

27. The method according to claim 26, wherein the plurality of different metals comprises Au—Si, Al—Ge, Au—Sn, Cu—Sn, or Au—In.

28. The method according to claim 23, wherein the eutectic or solder bonding comprises solder bonding.

29. The method according to claim 28, wherein the solder bonding comprises bonding using a solder alloy, which solder alloy comprises a plurality of different metals selected from the group consisting of silver (Ag), gold (Au), chromium (Cr), copper (Cu), germanium (Ge), indium (In), manganese (Mn), lead (Pb), silicon (Si), tin (Sn), and zinc (Zn).

30. The method according to claim 29, wherein the plurality of different metals comprises Au—Sn.

* * * * *